(12) United States Patent
Schertel et al.

(10) Patent No.: US 11,721,518 B2
(45) Date of Patent: Aug. 8, 2023

(54) EXAMINING, ANALYZING AND/OR PROCESSING AN OBJECT USING AN OBJECT RECEIVING CONTAINER

(71) Applicant: Carl Zeiss Microscopy GmbH, Jena (DE)

(72) Inventors: Andreas Schertel, Aalen (DE); Andreas Schmaunz, Oberkochen (DE); Endre Majorovits, Aalen (DE); Bernd Stenke, Illertissen (DE); Stephan Hiller, Koenigsbronn (DE); Matthias Karl, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 17/160,679

(22) Filed: Jan. 28, 2021

(65) Prior Publication Data

US 2021/0241992 A1 Aug. 5, 2021

(30) Foreign Application Priority Data

Jan. 30, 2020 (DE) .......................... 102020102314.6

(51) Int. Cl.
*H01J 37/16* (2006.01)
*H01J 37/20* (2006.01)
(Continued)

(52) U.S. Cl.
CPC ............ *H01J 37/16* (2013.01); *H01J 37/145* (2013.01); *H01J 37/1475* (2013.01);
(Continued)

(58) Field of Classification Search
CPC .. H01J 37/00; H01J 37/02; H01J 37/16; H01J 37/145; H01J 37/1475; H01J 37/20;
(Continued)

(56) References Cited

U.S. PATENT DOCUMENTS

2004/0036031 A1 2/2004 Rose et al.
2012/0112064 A1 5/2012 Nagakubo et al.
(Continued)

FOREIGN PATENT DOCUMENTS

CN 209388997 U 9/2019
DE 11 2010 001 712 B4 11/2019
(Continued)

OTHER PUBLICATIONS

Nagakubo et al., "An introduction of air-protection cryo-holder", The Hitachi Scientific Instrument News—2015 Vol 6 ("Hitachi air protection TEM holder").
(Continued)

*Primary Examiner* — Jason L McCormack
(74) *Attorney, Agent, or Firm* — Muirhead and Saturnelli, LLC

(57) ABSTRACT

An object receiving container may receive an object which is examinable, analyzable and/or processable at cryo-temperatures. An object holding system may comprise an object receiving container. A beam apparatus or an apparatus for processing an object may comprise an object receiving container or an object holding system. An object may be examined, analyzed and/or processed using an object receiving container or an object holding system. The object receiving container may comprise a first container unit, a cavity for receiving the object, a second container unit, which is able to be brought into a first position and/or into a second position relative to the first container unit, and at least one fastening device which is arranged at the first container unit or at the second container unit for arranging the object receiving container at a holding device.

17 Claims, 17 Drawing Sheets

(51) Int. Cl.
*H01J 37/145* (2006.01)
*H01J 37/147* (2006.01)
*H01J 37/28* (2006.01)
*H01J 37/244* (2006.01)

(52) U.S. Cl.
CPC ............ *H01J 37/20* (2013.01); *H01J 37/244* (2013.01); *H01J 37/28* (2013.01); *H01J 2237/002* (2013.01); *H01J 2237/2001* (2013.01); *H01J 2237/2007* (2013.01)

(58) Field of Classification Search
CPC .......... H01J 37/244; H01J 37/26; H01J 37/28; H01J 2237/002; H01J 2237/2001; H01J 2237/2007; G01N 23/04; G01N 23/2202; G01N 23/2206; G01N 23/2251
USPC .......................................... 250/306, 307, 311
See application file for complete search history.

(56) References Cited

U.S. PATENT DOCUMENTS

| | | | |
|---|---|---|---|
| 2013/0014528 A1* | 1/2013 | Stabacinskiene | ............................ G01N 23/20033 62/129 |
| 2016/0005566 A1* | 1/2016 | Zewail | ..................... H01J 37/26 250/311 |
| 2018/0323036 A1* | 11/2018 | Mohammadi-Gheidari | ................ H01J 37/065 |
| 2021/0035771 A1* | 2/2021 | Shukla | ..................... H01J 37/28 |

FOREIGN PATENT DOCUMENTS

| | | |
|---|---|---|
| WO | WO 2002/067286 A2 | 8/2002 |
| WO | WO 2019/013633 A1 | 1/2019 |

OTHER PUBLICATIONS

Alexander Rigort, et al., "Improving Resolution and Signal-to-Noise in Cryo-Fluorescence Microscopy," Cryo-Confocal Imaging with Airyscan, Oberkochen, Germany, Oct. 2015.
Quorum, "PP3010 Cryo Preparation System for SEM, FE-SEM and FIB-SEM", Laughton (UK), Jun. 2019.
Leica brochure, Vienna (Austria) 2015.

* cited by examiner

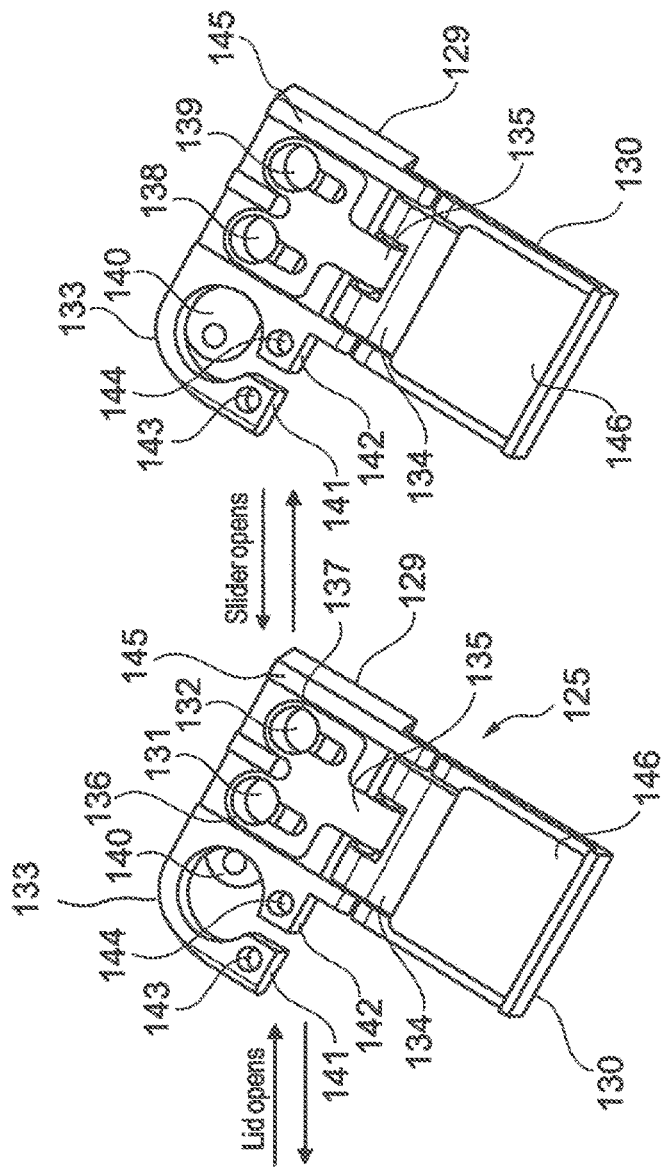
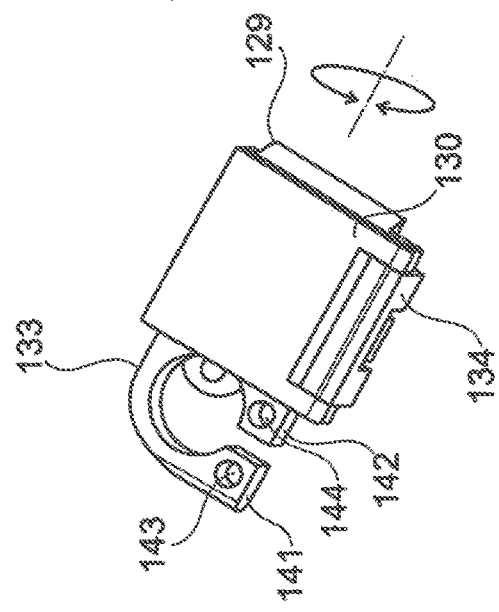
Fig. 9
Fig. 7
Fig. 8

EXAMINING, ANALYZING AND/OR PROCESSING AN OBJECT USING AN OBJECT RECEIVING CONTAINER

CROSS-REFERENCE TO RELATED APPLICATION

This application claims the priority of the German patent application No. 10 2020 102 314.6, filed on Jan. 30, 2020, which is incorporated herein by reference.

TECHNICAL FIELD

The system described herein relates to an object receiving container for receiving at least one object which is examinable, analyzable and/or processable at cryo-temperatures. Further, the system described herein relates to an object holding system comprising an object receiving container. Moreover, the system described herein relates to a beam apparatus and/or an apparatus for processing an object, comprising an object receiving container or comprising an object holding system. By way of example, the beam apparatus is embodied as a light beam apparatus and/or as a particle beam apparatus and/or as an x-ray beam apparatus. By way of example, the apparatus for processing the object is a microtome. Further, the system described herein relates to a method for examining, analyzing and/or processing an object using an object receiving container or an object holding system.

BACKGROUND OF THE INVENTION

The practice of examining and/or analyzing objects by light microscopy has been known for a long time. In light microscopy, use is made of a light microscope which may comprise a beam generator for generating a light beam, an objective lens for focusing the light beam onto the object and a display device for displaying an image and/or an analysis of the object. By way of example, the display device is embodied as an eyepiece.

Further, the practice of examining objects with electron beam apparatuses has been known for a long time. By way of example, electron beam apparatuses, in particular a scanning electron microscope (also referred to as SEM below) and/or a transmission electron microscope (also referred to as TEM below), are used to examine objects (samples) in order to obtain knowledge in respect of the properties and the behavior under certain con-ditions.

In an SEM, an electron beam (also referred to as primary electron beam below) is generated by means of a beam generator and focused onto an object to be examined by way of a beam guiding system. The primary electron beam is guided in a scanning manner over a surface of the object to be examined by means of a deflection device in the form of a scanning device. Here, the electrons of the primary electron beam may interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An imaging of the object to be examined is thus obtained.

In the case of a TEM, a primary electron beam is likewise generated by means of a beam generator and guided onto an object to be examined by means of a beam guiding system. The primary electron beam may pass through the object to be examined. When the primary electron beam passes through the object to be examined, the electrons of the primary electron beam may interact with the material of the object to be examined. The electrons passing through the object to be examined are imaged onto a luminescent screen or onto a detector (for example a camera) by a system consisting of an objective and a pro-jection unit. Here, imaging may also take place in the scanning mode of a TEM. As a rule, such a TEM is referred to as STEM. Additionally, provision can be made for detecting electrons backscattered at the object to be examined and/or secondary electrons emitted by the object to be examined by means of a further detector in order to image an object to be examined.

Furthermore, it is known from the prior art to use combination apparatuses for examining objects, wherein both electrons and ions can be guided onto an object to be examined. By way of example, it is known to equip an SEM additionally with an ion beam column. An ion beam generator arranged in the ion beam column may generate ions that are used for pre-paring an object (for example removing material of the object or applying material to the object) or else for imaging. For this purpose, the ions are scanned over the object by means of a deflection device in the form of a scanning device. The SEM may serve here in particular for observing the preparation, but also for further examination of the prepared or unprepared object.

The practice of arranging an object to be examined with a particle beam apparatus on an object holder, which in turn is arranged on an object stage, is known. The object stage is arranged in a sample chamber of the particle beam apparatus. The object stage has a movable embodiment, the movable embodiment of the object stage being ensured by a plurality of movement units, from which the object stage is assembled. The movement units facilitate a movement of the object stage in at least one specified direction. Object stages that have a plurality of translational movement units (e.g., approximately 3 to 4 translational movement units) and a plurality of rotational movement units (e.g., 2 to 3 rotational movement units), in particular, are known. By way of example, an object stage which is movably arranged along a first translation axis (for example, an x-axis), along a second translation axis (for example, a y-axis), and along a third translation axis (for example, a z-axis) is known. The first translation axis, the second translation axis and the third translation axis are oriented perpendicular to one another. Further, the known object stage is embodied to be rotatable about a first axis of rotation and about a second axis of rotation, which is aligned perpendicular to the first axis of rotation.

The driving force for a movement by means of the movement units is provided by stepper motors in the prior art. A respective stepper motor is provided for a respective movement along one of the translation axes or for a rotation about one of the axes of rotation. The stepper motors are arranged in the sample chamber of the particle beam apparatus or outside of the sample chamber of the particle beam apparatus. In the latter case, vacuum feed-throughs and mechanical devices are provided to ensure the actuation of the object stage by the stepper motors.

The prior art has further disclosed the examination of a frozen object using a light microscope and/or a particle beam apparatus. By way of example, this is advantageous when examining biological objects. To this end, the frozen object is arranged on an object holder, which is able to be cooled. By way of example, the object holder is able to be cooled to a temperature of −140° C. or less than −140° C. using liquid nitrogen or liquid helium. Both above and below, temperatures of below −50° C. are referred to as cryo-temperatures. The aforementioned object holder is arranged at the object stage of a light microscope or a particle beam apparatus.

By way of example, object holders are known from DE 11 2010 001 712 B4 and CN 209388997 U.

The practice of examining, analyzing and/or processing a frozen object using not only one apparatus but multiple apparatuses is known. By way of example, the frozen object is initially examined and/or processed using a light microscope and subsequently examined and/or processed using an SEM and/or an ion beam apparatus. In the process, it is necessary to ensure that the frozen object, which is arranged at an object holder, is safely transported from a first apparatus to a second apparatus. Further, it is necessary to ensure that the object holder facilitates, over a relatively long period of time, for example over a plurality of days or months, a secure storage of the frozen object to be examined. The above statement additionally or alternatively also applies to apparatuses used to mechanically process a frozen object, for example a microtome and/or a laser beam apparatus for cutting the frozen object. The above statement further additionally or alternatively applies to apparatuses used to apply layers to a frozen object, for example a sputtering apparatus for applying layers or an apparatus for electron beam-induced deposition of layers, for example using a gas, or for ion beam-induced deposition of layers, for example using a gas.

However, it was found that there always is the risk of a frozen object being contaminated during the examination, the analysis, the processing and/or a transportation of said frozen object, for example by the deposition of atmospheric water on the frozen object. There also is the risk of water deposition on a frozen object when the frozen object is stored, for example, in liquid nitrogen, in particular as a result of a deposition of water crystals, which swim in the liquid nitrogen, on the object to be examined. Contaminations can also be deposited on a frozen object in the case where the fully prepared frozen object remains in a sample chamber of a beam apparatus for a relatively long period of time. A layer of water forming on the frozen object makes an examination, an analysis and/or processing of the frozen object with a light microscope and/or a particle beam apparatus more difficult.

Moreover, it is known that light microscopes and/or particle beam apparatuses from different manufacturers respectively require very specific configurations of an object holder; oth-erwise, the object holder cannot be arranged at a certain light microscope or in the sample chamber of a specific particle beam apparatus. Expressed differently, a first object holder, for example, provided for a first particle beam apparatus is not suitable for reception in a second particle beam apparatus or in a light microscope on account of the physical configuration of said object holder. In this case, the prior art provides for a frozen object to be examined to be removed from the first object holder and to be arranged at a second object holder which, on account of the physical configuration thereof, is suitable for reception in the second particle beam apparatus or in the light microscope. This is quite inconvenient and often leads to, firstly, a contamination of the object and, secondly, damage to the object. Further, it was found that maintaining the orientation of a frozen object, which may be important for examining and processing the frozen object, is only possible with great difficulties.

It therefore may be desirable to have a device for holding and transporting a frozen object, which allows safe and simple transportation between two examination apparatuses and which is able to be arranged in as many different examination apparatuses and/or processing apparatuses as possible. Further, the device should facilitate secure storage of the frozen object.

SUMMARY OF THE INVENTION

In some embodiments of the system described herein, the object receiving container is configured to receive at least one object which is examinable, analyzable and/or processable at cryo-temperatures. The object receiving container may comprise at least one first container unit. At least one cavity for receiving the object may be arranged at the first container unit. By way of example, a plurality of cavities for receiving an object each may be arranged at the first container unit. In some embodiments, a first cavity for receiving a first object and for-a second cavity for receiving a second object may be arranged at the first container unit.

Further, in some embodiments of the system described herein, the object receiving container may comprise at least one second container unit, which may be embodied to be movable relative to the first container unit. Expressed differently, the first container unit and/or the second container unit may have such a movable embodiment that the second container unit adopts different positions relative to the first container unit. The second container unit may be able to be brought into a first position and/or into a second position relative to the first container unit. In the second position of the second container unit, the second container unit may cover the cavity arranged at the first container unit or the cavities arranged at the first container unit. Expressed differently, the cavity arranged at the first container unit, and hence the object arranged in the cavity, may not be accessible on account of the cavity being covered by the second container unit situated in the second position. By contrast, if the second container unit is situated in the first position relative to the first container unit, the cavity and the object arranged therein may be accessible. If a plurality of cavities are arranged at the first container unit, then the cavities arranged at the first container unit, and hence the objects arranged in the cavities, may not be accessible on account of the cavities being covered by the second container unit situated in the second position. By contrast, if the second container unit is situated in the first position relative to the first container unit, the cavities and the objects arranged therein may be accessible.

Further, in some embodiments of the system described herein, the object receiving container may comprise at least one fastening device which is arranged at the first container unit or at the second container unit, for the purposes of arranging the object receiving container at a holding device. The holding device may be an adapter device, for example, which is arrangeable at a receiving device of a beam apparatus and/or an apparatus for processing an object and/or a mounting device. Expressed differently, the holding device may be an adapter device, for example, which can be arranged at a receiving device of the beam apparatus and/or the apparatus for processing an object and/or the mounting device.

In some embodiments of the system described herein, the object receiving container al-lows safe and simple transportation between two examination apparatuses. In particular, the object receiving container may be configured to ensure protection against contamination of the object arranged in the cavity on account of the relative movement of the second container unit with respect to the first container unit into the second position and on account of the cover obtained therewith. Moreover, the object receiving container may be configured to ensure that the object can be stored safely over a relatively long period of time, for example multiple days or months. Since the object may not need be removed from the object receiving container during storage, for example in a nitrogen-cooled storage container, the orientation of the object in the object receiving container may not change. This orientation may simplify a subsequent examination of the object by means of an examination apparatus since the object receiving container may be insertable into the examination apparatus after removing the object receiving container from the storage container, with the orientation of the object already known. Information about the alignment and orientation of the object may be arranged at the object receiving container by means of a marking. Further, in some embodiments, the object receiving container may ensure that the latter can be arranged in as many different examination apparatuses as possible. By way of example, the object receiving container according to the invention may be arrangeable at a holding device in the form of an adapter device. The adapter device may be configured in such a way that the object receiving container may be arranged at a receiving device of a respective beam apparatus and/or an apparatus for processing an object and/or a mounting device by means of the adapter device. In contrast to the prior art, the system described herein may make it possible for the object to not have to be arranged at respective different object holders, which have a physical configuration specified for a respective apparatus, for the purposes of examining and/or processing an object in different apparatuses. Rather, the system described herein may provide for the object to be arranged only once at the object receiving container, which is then receivable in the various examination apparatuses.

The aforementioned holding device may have any suitable configuration. By way of example, the holding device may have an angled surface, at which the object receiving container may be arranged. As a result, it may no longer be mandatory for the holding device, and hence also the object receiving container, to be rotated about an axis of rotation, for example in a sample chamber of a particle beam apparatus. Moreover, the holding device may comprise at least one receptacle for receiving actuation devices, in particular manipulators, by means of which the holding device may be moved.

In one embodiment of the object receiving container according to the system described herein, the second container unit may be arranged at a displacing device in such a way that the second container unit is able to be displaced into the first position and/or into the second position relative to the first container unit. Expressed differently, the first container unit and/or the second container unit may be displaceable such that the second container unit may be arranged in the first position and/or in the second position relative to the first container unit. The second container unit may cover the cavity arranged at the first container unit when the second container unit is in the second position relative to the first container unit. If a plurality of cavities are arranged at the first container unit, the second container unit may cover the cavities arranged at the first container unit. By contrast, if the second container unit is situated in the first position relative to the first container unit, the cavity and the object arranged therein may be accessible. If a plurality of cavities are arranged at the first container unit, then the cavities and the objects arranged therein may be accessible.

In a further embodiment, the second container unit may be embodied as a dis-placing device.

In a further embodiment of the object receiving container according to the system described herein, the object receiving container may comprise at least one hinge device which is arranged both at the first container unit and at the second container unit in such a way that the second container unit is able to be brought into the first position and/or into the second position relative to the first container unit. Expressed differently, the first container unit and/or the second container unit may be embodied to be movable in such a way on account of the hinge device that the second container unit may be arranged in the first position and/or in the second position relative to the first container unit. The second container unit may cover the cavity arranged at the first container unit when the second container unit is in the second position relative to the first container unit. If a plurality of cavities are arranged at the first container unit, the second container unit may cover the cavities arranged at the first container unit. By contrast, if the second container unit is situated in the first position relative to the first container unit, the cavity and the object arranged therein may be accessible. If a plurality of cavities are arranged at the first container unit, then the cavities and the objects arranged therein may be accessible.

In one embodiment of the object receiving container according to the system described herein, the second container unit may be rotatable into the first position and/or into the second position relative to the first container unit. By way of example, the second container unit may be rotatable about a surface normal of the first container unit and/or the second container unit into the first position and/or into the second position relative to the first container unit.

In a further embodiment of the object receiving container according to the system described herein, the second container unit may have at least one through hole. By way of example, the second container unit may be embodied as a perforated panel, i.e., as a panel with at least one through hole. In the first position of the second container unit relative to the first container unit, the through hole may be arranged at the cavity such that the cavity and the object arranged therein are accessible. If a plurality of cavities are arranged in the first container unit, then the cavities and the objects arranged therein may be accessible, the through hole being arranged at the cavities or each cavity of the plurality of cavi-ties having a respective through hole arranged thereagainst.

In an even further embodiment of the object receiving container according to the system described herein, the second container unit may be embodied as a leaf shutter. The leaf shutter may comprise movably embodied blades, which may be movable into the first position and/or into the second position.

In yet a further embodiment of the object receiving container according to the system described herein, the fastening device may comprise at least one spring device. By way of example, the fastening device may be embodied as a spring device. For example, the fastening device may comprise at least one snap ring and/or to be embodied as a snap ring. The embodiment of the fastening device as a spring device may be simple in terms of design and therefore cost-effective in terms of production.

In an even further embodiment of the object receiving container according to the system described herein, the fastening device may comprise a clamping device or to be embodied as a clamping device. For example, the fastening device may have a first clamping part and a second clamping part. In addition or as an alternative thereto, the fastening device may comprise a screw and/or an eccentric disk, wherein the screw and/or the eccentric disk may be used to clamp the object receiving container at a holding device. The embodiment of the fastening device as a clamping device likewise may be simple in terms of design and therefore cost-effective in terms of production.

In one embodiment of the object receiving container according to the system described herein, the fastening device may have at least one first spring end and at least one second spring end. The first spring end and the second spring end may be arranged at a distance from one another. Further, the first spring end may be embodied so as to be movable relative to the second spring end. Expressed differently, the first spring end and/or the second spring end may have a movable embodiment. This may ensure that the object receiving container according to the invention may be held in clamping fashion at the holding device and is easily detachable from the holding device again.

In a further embodiment of the object receiving container according to the system described herein, the first spring end may have a first engagement opening for the engagement of an actuation tool and the second spring end may have a second engagement opening for the engagement of the actuation tool. This arrangement may ensure a simple operation of the fastening device in the form of the spring device, so that the object receiving container according to the system described herein is able to be easily mounted on the holding device and is easily detachable from the holding device again.

In yet a further embodiment of the object receiving container according to the system described herein, the first container unit may have a first surface, wherein the first surface is arranged in a first plane. Further, the second container unit may have a second surface, wherein the second surface is arranged in a second plane. Moreover, the first surface of the first container unit may rest against the second surface of the second container unit in the second position of the second container unit relative to the first container unit such that the cavity arranged at the first container unit is covered by the second surface of the second container unit. If a plurality of cavities are arranged at the first container unit, then these cavities may be covered by the second surface of the second container unit. By contrast, in the first position of the second container unit relative to the first container unit, the first surface of the first container unit may be arranged with respect to the second surface of the second container unit in such a way that the first plane is aligned with respect to the second plane as follows: (i) the first plane is aligned parallel to the second plane or (ii) the first plane is identical to the second plane or (iii) the first plane is aligned at an angle of more than 5° with respect to the second plane.

In an even further embodiment of the object receiving container according to the system described herein, the cavity may have at least one first cavity opening and at least one second cavity opening. If a plurality of cavities are arranged at the first container unit, at least one of the cavities may have a first cavity opening and a second cavity opening. In one embodiment, a plurality of cavities each may have a first cavity opening and a second cavity opening. The second container unit may cover the first cavity opening or the first cavity openings when the second container unit is in the second position relative to the first container unit. Moreover, a covering device for covering the second cavity opening or the second cavity openings may be arranged at the second cavity opening or at the second cavity openings. The openings of the cavity may be covered by different units in this embodiment. The first cavity opening may be covered by the second container unit. By contrast, the second cavity opening may be covered by the covering device. If a plurality of first cavity openings and a plurality of second cavity openings are present, the plurality of first cavity openings may be covered by the second container unit. By contrast, the plurality of second cavity openings may be covered by the covering device. In a further embodiment, the plurality of second cavity openings each may have a covering device, said covering devices being used to cover the respective second cavity openings.

In one embodiment of the object receiving container according to the system described herein, the first cavity opening and the second cavity opening may be arranged opposite one another. For example, the covering device may be embodied as a sliding device. Expressed differently, the covering device may be displaceable relative to the second cavity opening such that the covering device is able to be brought into a covering position and into an exposing position. The second cavity opening may be covered by the covering device in the covering position. In the exposing position, the object may be accessible through the second cavity opening. If a plurality of cavities, which each have a first cavity opening and each have a second cavity opening, are arranged at the first container unit, then provision may be made in this embodiment for the covering device to be displaceable relative to the second cavity openings in such a way that the covering device is able to be brought into a covering position and into an exposing position. The second cavity openings may be covered by the covering device in the covering position. The objects arranged in the cavities may be accessible through the second cavity openings in the exposing position. If a respective covering device is arranged at a respective second cavity opening, then provision may be made in this embodiment for the respective covering device to be displaceable relative to the respective second cavity opening in such a way that the respective covering device may be able to be brought into a covering position and into an ex-posing position. The respective second cavity opening may be covered by the respective covering device in the covering position. In the exposing position, the object arranged in the respective cavity may be accessible through the respective second cavity opening. The aforementioned embodiments may be advantageous if examinations of the object are car-ried out, within the scope of which particles of a particle beam may be transmitted through the object and/or interaction particles which arise on account of an interaction of a particle beam with the object may emerge from the object at a side of the object arranged at the second cavity opening. The transmitted particles and/or the interaction particles may then be detected by a detector.

The system described herein also may relate to an object holding system comprising at least one object receiving container, having at least one of the features specified further above or yet to be specified below or a combination of at least two of the features specified further above or yet to be specified below. Moreover, the object holding system according to the system described herein may be provided with at least one holding device which may comprise a receptacle. The fastening device of the object receiving container may be arrangeable at the receptacle. The holding device is, for example, an adapter device, which is arrangeable at a receiving device of a beam apparatus and/or an apparatus for processing an object and/or a mounting device. The adapter device may be configured in such a way that the object receiving container may be arranged at the receiving device of the respective beam apparatus and/or the respective apparatus for processing an object and/or the respective mounting device by means of the adapter device. In contrast to the prior art, the invention therefore renders it possible that an object to be examined need not be arranged multiple times at different object holders; instead, said object may be arranged a single time at the object receiving container according to the invention, which then may be receivable in different examination apparatuses.

The aforementioned holding device of the object holding system according to the system described herein may have any suitable configuration. By way of example, the holding device may have an angled surface, at which the object receiving container is arranged. As a result, it may no longer be mandatory for the holding device, and hence also the object receiving container, to be rotated about an axis of rotation, for example in a sample chamber of a particle beam apparatus. Moreover, the holding device may comprise receptacles for receiving actuation devices, in particular manipulators, by means of which the holding device may be moved.

The system described herein also may relate to a beam apparatus for imaging, analyzing and/or processing an object. The beam apparatus according to the system described herein may comprise at least one beam generator for generating a beam, at least one objective lens for focusing the beam onto the object, at least one display device for displaying an image and/or an analysis of the object and at least one cooling device for cooling the object to cryo-temperatures. By way of example, liquid nitrogen or liquid helium is arranged in the cooling device. Moreover, the beam apparatus according to the invention is provided with an object receiving container, having at least one of the features specified further above or yet to be specified below or a combination of at least two of the features specified further above or yet to be specified below. As an alternative thereto, the beam apparatus may comprise at least one object holding system having at least one of the features specified further above or yet to be specified below or a combination of at least two of the features specified further above or yet to be specified below.

In one embodiment of the beam apparatus according to the system described herein, the beam apparatus is embodied as a particle beam apparatus. Then, the beam generator may be embodied as a beam generator for generating a particle beam with charged particles. The charged particles may be electrons or ions, for example. The objective lens of the particle beam apparatus according to the invention may serve to focus the particle beam onto the object. Moreover, the particle beam apparatus according to the system described herein may comprise at least one scanning device for scanning the particle beam over the object. Further, the particle beam apparatus according to the system described herein may comprise at least one detector for detecting interaction particles and/or interaction radiation which may emerge from an interaction between the particle beam and the object when the particle beam is incident on the object.

In one embodiment of the particle beam apparatus according to the system described herein, the beam generator is embodied as a first beam generator and the particle beam is embodied as a first particle beam comprising first charged particles. Further, the objective lens may be embodied as a first objective lens for focusing the first particle beam onto the object. Moreover, the particle beam apparatus according to the system described herein may comprise at least one second beam generator for generating a second particle beam comprising second charged particles. Further, the particle beam apparatus according to the system described herein may comprise at least one second objective lens for focusing the second particle beam onto the object.

In particular, the beam apparatus may be embodied as an electron beam apparatus and/or as an ion beam apparatus.

In an even further embodiment of the beam apparatus according to the system described herein, the beam apparatus may be a light beam apparatus. Consequently, the beam generator may be embodied to generate light beams.

The system described herein also may relate to an apparatus for processing an object, comprising at least one processing device for processing the object and at least one cooling device for cooling the object to cryo-temperatures. Moreover, the apparatus according to the system described herein may be provided with an object receiving container arranged at the cooling device and having at least one of the features specified further above or yet to be specified below or a combination of at least two of the features specified further above or yet to be specified below. As an alternative thereto, the apparatus may comprise at least one object holding system arranged at the cooling device and having at least one of the features specified further above or yet to be specified below or a combination of at least two of the features specified further above or yet to be specified below. By way of example, the processing device is embodied as a mechanical cutting device and/or as a laser cutting device and/or as a device for electron beam-induced deposition of layers on the object, for example using a gas, and/or as a device for ion beam-induced deposition of layers on the object, for example using a gas, and/or as a sputtering apparatus.

The system described herein also may relate to a method for examining, analyzing and/or processing an object at cryo-temperatures, having any one of the following steps: (i) using an object receiving container having one of the features specified further above or yet to be specified below or a combination of at least two of the features specified further above or yet to be specified below; (ii) using an object holding system having one of the features specified further above or yet to be specified below or a combination of at least two of the features specified further above or yet to be specified below; (iii) using a beam apparatus having one of the features specified further above or yet to be specified below or a combination of at least two of the features specified further above or yet to be specified below; or (iv) using an apparatus for processing an object having one of the features specified further above or yet to be specified below or a combination of at least two of the features specified further above or yet to be specified below.

In one embodiment of the method according to the system described herein, the method may include the following steps:

moving the second container unit relative to the first container unit in such a way that the second container unit adopts the first position relative to the first container unit and that the cavity arranged at the first container unit or the cavities arranged at the first container unit is/are accessible. Expressed differently, the first container unit and/or the second container unit may be moved in such a way that the second container unit adopts the first position relative to the first container unit such that the cavity arranged at the first container unit or the cavities arranged at the first container unit is/are accessible. By way of example, the first container unit and/or the second container unit may be moved by means of a tool. In addition or as an alternative thereto, the object receiving container may be moved in such a way that the first container unit and/or the second container unit move/moves on account of gravity such that the second container unit is brought into the first position relative to the first container unit;

arranging the object in the cavity or arranging a respective object in a respective cavity of the plurality of cavities. By way of example, an object may be arranged in a cavity of the first container unit with the aid of a mounting device. By way of example, the mounting device has an interior, which may be surrounded by an insulated wall. By way of example, a holder for the object receiving container may be arranged in the interior. By filling the interior, for example with liquid nitrogen or liquid helium, the holding device and the object receiving container may be cooled to cryo-temperatures such that the object may be arranged in the cavity under cryo-temperatures;

moving the second container unit relative to the first container unit in such a way that the second container unit adopts the second position and that the cavity arranged in the first container unit or the cavities arranged in the first container unit is/are covered by the second container unit. Expressed differently, the first container unit and/or the second container unit may be moved in such a way that the second container unit adopts the second position relative to the first container unit such that the cavity arranged at the first container unit or the cavities arranged at the first container unit is/are covered by the second container unit. By way of example, the first container unit and/or the second container unit may be moved by means of a tool. In addition or as an alternative thereto, the object receiving container may be moved in such a way that the first container unit and/or the second container unit move/moves on account of gravity such that the second container unit is brought into the second position relative to the first container unit;

arranging the object receiving container at the holding device of the object holding system by arranging the fastening device of the object receiving container at the receptacle of the holding device in such a way that the fastening device is held at the receptacle. By way of example, a spring device may be used as fastening device. In particular, the fastening device may comprise at least one snap ring and/or may be embodied as a snap ring. Further the spring device may have a first spring end and a second spring end. The first spring end and the second spring end may be arranged at a distance from one another. Further, the first spring end may be embodied so as to be movable relative to the second spring end. By way of example, the first spring end has a first engagement opening for the engagement of an actuation tool and the second spring end has a second engagement opening for the engagement of the actuation tool. This arrangement may ensure a simple operation of the spring device such that the object receiving container according to the system described herein is able to be easily assembled at the holding device, is held at the holding device in clamping fashion and maybe easily released from the holding device again. In addition or as an alternative thereto, the fastening device may comprise a clamping device or be embodied as a clamping device such that the object receiving container is held at the holding device of the object holding system in clamping fashion. In particular, to this end, the fastening device may have a first clamping part and a second clamping part. In addition or as an alternative thereto, the fastening device may comprise a screw and/or an eccentric disk, wherein the screw and/or the eccentric disk may be used to clamp the object receiving container at the holding device;

introducing the holding device of the object holding system into the beam apparatus or the apparatus for processing the object;

arranging the holding device at the cooling device of the beam apparatus or of the apparatus for processing the object;

moving the second container unit relative to the first container unit in such a way that the second container unit adopts the first position and that the object arranged in the cavity or the objects arranged in the cavities is/are accessible. Expressed differently, the first container unit and/or the second container unit may be moved in such a way that the second container unit adopts the first position relative to the first container unit such that the cavity arranged at the first container unit or the cavities arranged at the first container unit is/are accessible. By way of example, the first container unit and/or the second container unit may be moved by means of a tool. In addition or as an alternative thereto, the object receiving container may be moved in such a way that the first container unit and/or the second container unit move/moves on account of gravity such that the second container unit is brought into the first position relative to the first container unit; and examining, analyzing and/or processing the object using the beam apparatus or the apparatus for processing the object.

In an even further embodiment of the method according to the system described herein, the method may include the following steps:

arranging the holding device at a transportation device. By way of example, the transportation device may be a device which is movable by means of a manipulator and which may be movable from a workstation arranged at the beam apparatus or the apparatus for processing the object into a sample chamber of the beam apparatus or of the apparatus for processing the object. By way of example, such a transportation device may be referred to as a "shuttle";

introducing the transportation device into the beam apparatus or the apparatus for processing the object; and arranging the transportation device at the cooling device.

In yet a further embodiment of the method according to the system described herein, the method may include the following step: moving the covering device in relative fashion for covering or exposing the second cavity opening or second cavity openings.

Explicit reference is made to the fact that the temporal sequence of individual steps of the method according to the system described herein is able to be chosen freely. Accordingly, the method according to the system described herein is not restricted to the aforementioned sequence of the steps of the method according to the system described herein.

Embodiments of: the object receiving container according to the system described herein, the object holding system according to the system described herein, the beam apparatus according to the system described herein and/or the apparatus for processing the object according to the system described herein and/or the method according to the system described herein may ensure that an object arranged in the object receiving container according to the system described herein is easily examinable, analyzable and/or processable under cryo-temperatures using different work processes. By way of example, the object receiving container according to embodiments of the system described herein may be used to examine and/or analyze the object by means of x-ray spectroscopy, by means of near field scanning microscopy, by means of atomic force microscopy, by means of a combination apparatus having an ion beam apparatus and an electron beam apparatus, by means of transmission electron microscopy, by means of Raman spectroscopy and/or by means of secondary ion mass spectrometry. In addition or as an alternative thereto, the object receiving container according to embodiments of the system described herein may be used when polishing the object, when cutting the object by means of a blade or a laser and/or when applying materials to the object. The aforementioned lists should be understood to be illustrative. The object receiving container according to embodiments of the system described herein may be used for any desired and suitable method.

By way of example, the beam apparatus according to embodiments of the system described herein, as explained further above or yet to be explained below, or the apparatus according to embodiments of the system described herein for processing the object may comprise a processor. Loaded onto the processor may be a computer program product which controls the beam apparatus or the apparatus for processing the object in such a way that the method according to embodiments of the system described herein having one of the features specified further above or yet to be specified below or a combination of at least two of the features specified further above or yet to be specified below is carried out.

BRIEF DESCRIPTION OF THE DRAWINGS

The system described herein will be explained in more detail below on the basis of embodiments using drawings. In detail:

FIG. 7 shows a first schematic illustration of an object receiving container, according to an embodiment of the system described herein;

FIG. 8 shows a second schematic illustration of the object receiving container according to FIG. 7, according to an embodiment of the system described herein;

FIG. 9 shows a third schematic illustration of the object receiving container according to FIG. 7, according to an embodiment of the system described herein;

DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein may be used in any particle beam apparatus, in particular in any electron beam apparatus and/or any ion beam apparatus. Further, the system described herein will be explained in more detail on the basis of a light microscope and an apparatus for processing an object.

Figure 1:
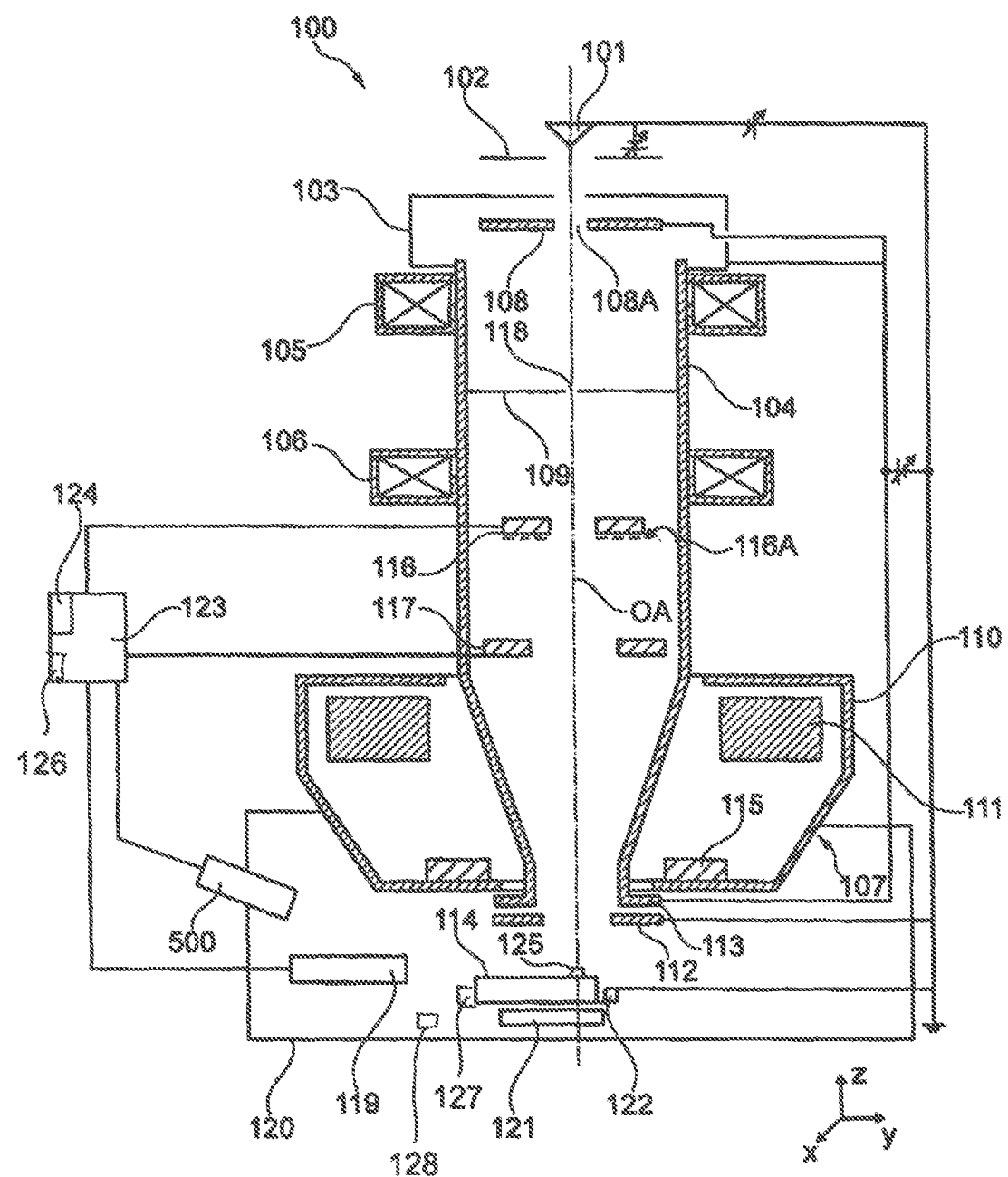
FIG. 1 shows a first embodiment of a particle beam apparatus of the system described herein.

FIG. 1 shows a schematic illustration of an SEM 100. The SEM 100 may comprise a first beam generator in the form of an electron source 101, which may be embodied as a cathode. Further, the SEM 100 may be provided with an extraction electrode 102 and with an anode 103, which may be placed onto one end of a beam guiding tube 104 of the SEM 100. By way of example, the electron source 101 may be embodied as a thermal field emitter. However, the system described herein is not restricted to such an electron source 101. Rather, any electron source is utilizable.

Electrons emerging from the electron source 101 may form a primary electron beam. The electrons may be accelerated to the anode potential on account of a potential difference between the electron source 101 and the anode 103. In the embodiment illustrated here, the anode potential may be 100 V to 35 kV, e.g. 5 kV to 15 kV, in particular 8 kV, relative to a ground potential of a housing of a sample chamber 120. However, alternatively it also may be at ground potential.

Two condenser lenses, specifically a first condenser lens 105 and a second condenser lens 106, may be arranged at the beam guiding tube 104. Here, proceeding from the electron source 101 as viewed in the direction of a first objective lens 107, the first condenser lens 105 may be arranged first, followed by the second condenser lens 106. Reference is explicitly made to the fact that further embodiments of the SEM 100 may have only a single condenser lens. A first aperture unit 108 may be arranged between the anode 103 and the first condenser lens 105. Together with the anode 103 and the beam guiding tube 104, the first aperture unit 108 may be at a high voltage potential, specifically the potential of the anode 103, or connected to ground. The first aperture unit 108 may have numerous first apertures 108A, of which one is illustrated in FIG. 1. By way of example, two first apertures 108A are present. Each one of the numerous first apertures 108A may have a different aperture diameter. By means of an adjustment mechanism (not illustrated), it may be possible to set a desired first aperture 108A onto an optical axis OA of the SEM 100. Reference is explicitly made to the fact that, in further embodiments, the first aperture unit 108 may be provided with only a single first aperture 108A. In this embodiment, an adjustment mechanism may be absent. The first aperture unit 108 then may be designed to be stationary. A stationary second aperture unit 109 may be arranged between the first condenser lens 105 and the second condenser lens 106. As an alternative thereto, the second aperture unit 109 may be embodied in a movable fashion.

The first objective lens 107 may have pole pieces 110, in which a hole may be formed. The beam guiding tube 104 may be guided through this hole. A coil 111 may be arranged in the pole pieces 110.

An electrostatic retardation device may be arranged in a lower region of the beam guiding tube 104, and may comprise an individual electrode 112 and a tube electrode 113. The tube electrode 113 may be arranged at one end of the beam guiding tube 104, which faces an object receiving container 125. The object receiving container 125 may be arranged at a holding device 114. An object may be arranged at the object receiving container 125. This is explained in more detail below.

Together with the beam guiding tube 104, the tube electrode 113 may be at the potential of the anode 103, while the individual electrode 112 and an object arranged at the object receiving container 125 may be at a lower potential in relation to the potential of the anode 103. In the present case, this may be the ground potential of the housing of the sample chamber 120. In this way, the electrons of the primary electron beam may be decelerated to a desired energy, which may be required for examining the object.

The SEM 100 further may comprise a scanning device 115, by means of which the primary electron beam may be deflected and scanned over the object. Here, the electrons of the primary electron beam may interact with the object. As a result of the interaction, interaction particles arise, which may be detected. In particular, electrons may be emitted from the surface of the object—so-called secondary electrons—or electrons of the primary electron beam may be backscattered—so-called backscattered electrons—as interaction particles.

The object and the individual electrode 112 may also be at different potentials and potentials different than ground. It is thereby possible to set the location of the retardation of the primary electron beam in relation to the object. If, by way of example, the retardation is carried out quite close to the object, imaging aberrations become smaller.

A detector arrangement comprising a first detector 116 and a second detector 117 may be arranged in the beam guiding tube 104 for detecting the secondary electrons and/or the backscattered electrons. Here, the first detector 116 may be arranged on the source side along the optical axis OA, while the second detector 117 may be arranged on the object side along the optical axis OA in the beam guiding tube 104. The first detector 116 and the second detector 117 may be arranged offset from one another in the direction of the optical axis OA of the SEM 100. Both the first detector 116 and the second detector 117 each may have a passage opening, through which the primary electron beam may pass. The first detector 116 and the second detector 117 may be approximately at the potential of the anode 103 and of the beam guiding tube 104. The optical axis OA of the SEM 100 extends through the respective passage openings.

The second detector 117 may serve principally for detecting secondary electrons. Upon emerging from the object, the secondary electrons initially have a low kinetic energy and arbitrary directions of motion. By means of the strong extraction field emanating from the tube electrode 113, the secondary electrons may be accelerated in the direction of the first objective lens 107. The secondary electrons enter the first objective lens 107 approximately parallel. The beam diameter of the beam of the secondary electrons may remain small in the first objective lens 107 as well. The first objective lens 107 then may have a strong effect on the secondary electrons and may generate a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that may be backscattered at the object—that is to say backscattered electrons which have a relatively high kinetic energy in comparison with the secondary electrons upon emerging from the object—may be detected by the second detector 117. The high kinetic energy and the angles of the backscattered electrons with respect to the optical axis OA upon emerging from the object may have the effect that a beam waist, that is to say a beam region having a minimum diameter, of the backscattered electrons lies in the vicinity of the second detector 117. A large portion of the backscattered electrons may pass through the passage opening of the second detector 117. Therefore, the first detector 116 substantially may serve to detect the backscattered electrons.

In a further embodiment of the SEM 100, the first detector 116 may additionally be embodied with an opposing field grid 116A. The opposing field grid 116A may be arranged at the side of the first detector 116 directed toward the object. With respect to the potential of the beam guiding tube 104, the opposing field grid 116A may have a negative potential such that only backscattered electrons with a high energy pass through the opposing field grid 116A to the first detector 116. In addition or as an alternative thereto, the second detector 117 may have a further opposing field grid, which may have an analogous embodiment to the aforementioned opposing field grid 116A of the first detector 116 and which may have an analogous function.

Further, the SEM 100 may have in the sample chamber 120 a chamber detector 119, for example an Everhart-Thornley detector or an ion detector, which may have a detection surface that is coated with metal and blocks light.

The detection signals generated by the first detector 116, the second detector 117 and the chamber detector 119 may be used to generate an image or images of the surface of the object.

Reference is explicitly made to the fact that the apertures of the first aperture unit 108 and of the second aperture unit 109, as well as the passage openings of the first detector 116 and of the second detector 117, are illustrated in exaggerated fashion. The passage openings of the first detector 116 and of the second detector 117 may have an extent perpendicular to the optical axis OA in the range of 0.5 mm to 5 mm. By way of example, they are of circular design and may have a diameter in the range of 1 mm to 3 mm perpendicular to the optical axis OA.

The second aperture unit 109 may be configured as a pinhole unit in the embodiment illustrated here and is provided with a second aperture 118 for the passage of the primary electron beam, which may have an extent in the range from 5 µm to 500 µm, e.g., 35 µm. As an alternative thereto, the second aperture unit 109 may be provided with a plurality of apertures, which may be displaced mechanically with respect to the primary electron beam or which may be reached by the primary electron beam by the use of electrical and/or magnetic deflection elements. The second aperture unit 109 may be embodied as a pressure stage unit. This separates a first region, in which the electron source 101 may be arranged and in which an ultra-high vacuum ($10^{-7}$ hPa to $10^{-12}$ hPa) prevails, from a second region, which may have a high vacuum ($10^{-3}$ hPa to $10^{-7}$ hPa). The second region may be the intermediate pressure region of the beam guiding tube 104, which leads to the sample chamber 120.

The sample chamber 120 may be under vacuum. For the purposes of producing the vacuum, a pump (not illustrated) is arranged at the sample chamber 120. In the embodiment illustrated in FIG. 1, the sample chamber 120 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 120 may be vacuum-sealed.

The holding device 114 may be arranged at an object stage 122. The object stage 122 may be embodied to be movable in three directions arranged perpendicular to one another, specifically in an x-direction (first stage axis), in a y-direction (second stage axis), and in a z-direction (third stage axis). Moreover, the object stage 122 may be rotated about two rotation axes which may be arranged perpendicular to one another (stage rotation axes). The system described herein is not restricted to the object stage 122 described above. Rather, the object stage 122 may have further translation axes and rotation axes along which or about which the object stage 122 may move.

In a further embodiment of the SEM 100, the holding device 114 may be embodied as an object receiving device, for example in the form of a manipulator and/or a gripper for holding the object receiving container 125. Then, the holding device 114 may have a movable embodiment, for example as explained above and further below in respect of the object stage 122.

The SEM 100 further may comprise a third detector 121, which may be arranged in the sample chamber 120. More precisely, the third detector 121 may be arranged downstream of the holding device 114 when viewed from the electron source 101 along the optical axis OA. The holding device 114 may be rotated in such a way that the object arranged in the object receiving container 125 may have the primary electron beam radiated therethrough. When the primary electron beam passes through the object to be examined, the electrons of the primary electron beam may interact with the material of the object to be examined. The electrons passing through the object to be examined may be detected by the third detector 121.

Arranged at the sample chamber 120 may be a radiation detector 500, which may be used to detect interaction radiation, for example x-ray radiation and/or cathodoluminescence light. The radiation detector 500, the first detector 116, the second detector 117, and the chamber detector 119 may be connected to a control unit 123, which may comprise a monitor 124. The third detector 121 also may be connected to the control unit 123. This is not illustrated for reasons of clarity. The control unit 123 may process detection signals that are generated by the first detector 116, the second detector 117, the chamber detector 119, the third detector 121 and/or the radiation detector 500 and displays said detection signals in the form of images on the monitor 124.

The control unit 123 may comprise a database 126, in which the control unit 123 may store data and/or from which data may be loaded onto a processor of the control unit 123.

Arranged at the holding device 114 may be a cooling and/or heating device 127, which may be used for cooling and/or heating the holding device 114 and/or the object receiving container 125 and hence the object arranged therein. This is discussed in more detail further below.

To determine a temperature of the object, a temperature of the holding device 114, a temperature of the object receiving container 125 and/or a temperature of the object stage 122, a temperature measuring unit 128 may be arranged in the sample chamber 120. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the SEM 100 may comprise the processor or may be embodied as a processor. A computer program product that controls the SEM 100 in such a way that the method according to embodiments of the system described herein is carried out may be loaded onto the processor. This is discussed in more detail further below.

Figure 2:
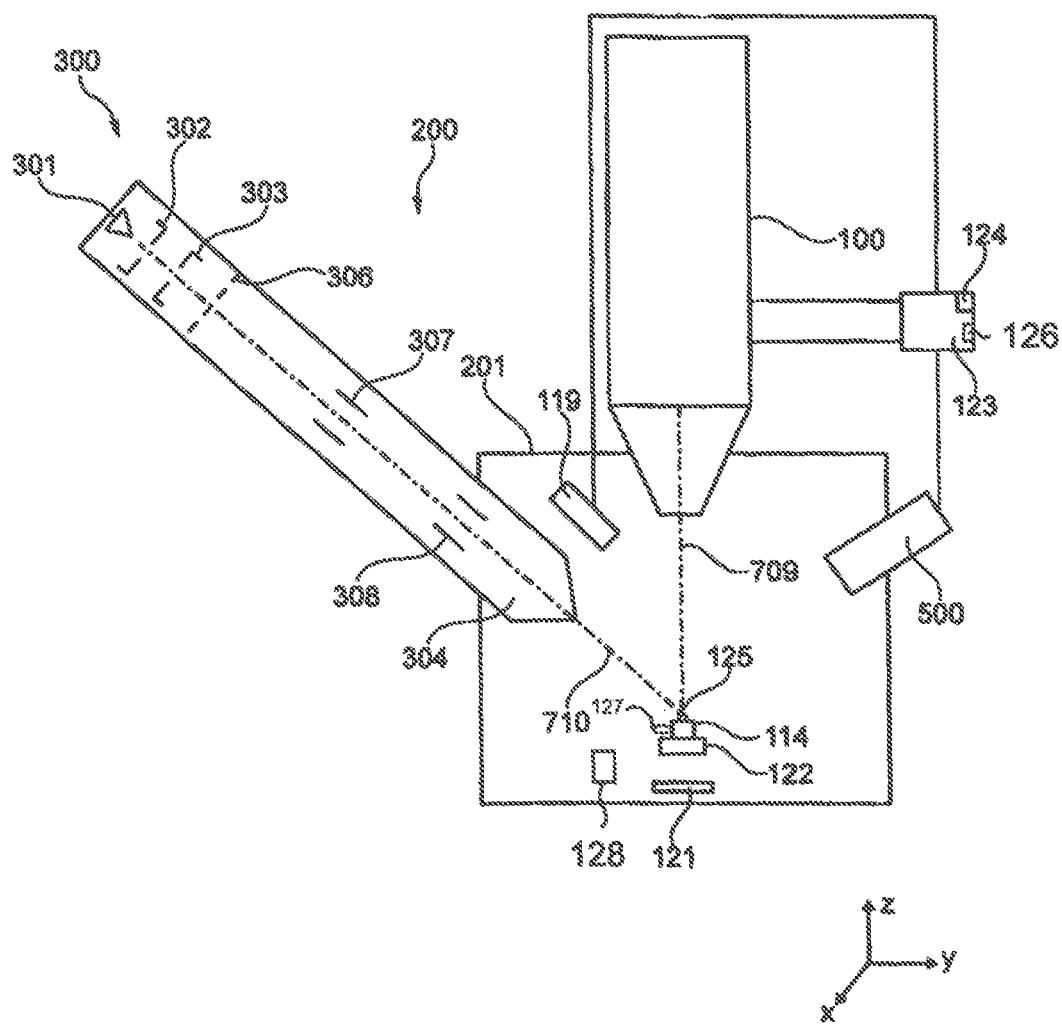
FIG. 2 shows a second embodiment of a particle beam apparatus of the system described herein.

FIG. 2 shows a particle beam apparatus in the form of a combination apparatus 200. The combination apparatus 200 may have two particle beam columns. Firstly, the combination apparatus 200 may be provided with the SEM 100, as already illustrated in FIG. 1, but without the sample chamber 120. Rather, the SEM 100 may be arranged at a sample chamber 201. The sample chamber 201 may be under vacuum. For the purposes of producing the vacuum, a pump (not illustrated) may be arranged at the sample chamber 201. In the embodiment illustrated in FIG. 2, the sample chamber 201 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 201 may be vacuum-sealed.

Arranged in the sample chamber 201 may be a chamber detector 119 which is embodied, for example, in the form of an Everhart-Thornley detector or an ion detector and which may have a detection surface that is coated with metal and blocks light. Further, the third detector 121 may be arranged in the sample chamber 201.

The SEM 100 may serve to generate a first particle beam, specifically the primary electron beam already described further above, and has the optical axis, already specified above, which is provided with the reference sign 709 in FIG. 2 and which also may be referred to as first beam axis below. Secondly, the combination apparatus 200 may be provided with an ion beam apparatus 300, which likewise may be arranged at the sample chamber 201. The ion beam apparatus 300 likewise has an optical axis, which is provided with the reference sign 710 in FIG. 2 and which also may be referred to as second beam axis below.

The SEM 100 may be arranged vertically in relation to the sample chamber 201. By contrast, the ion beam apparatus 300 may be arranged in a manner inclined by an angle of approximately 0° to 90° in relation to the SEM 100. An arrangement of approximately 50° is illustrated by way of example in FIG. 2. The ion beam apparatus 300 may comprise a second beam generator in the form of an ion beam generator 301. Ions, which form a second particle beam in the form of an ion beam, may be generated by the ion beam generator 301. The ions may be accelerated by means of an extraction electrode 302, which may be at a predeterminable potential. The second particle beam then may pass through an ion optical unit of the ion beam apparatus 300, wherein the ion optical unit may comprise a condenser lens 303 and a second objective lens 304. The second objective lens 304 ultimately may generate an ion probe, which may be focused onto an object which may be arranged at an object receiving container 125. The object receiving container 125 may be arranged at a holding device 114. The holding device 114 may be arranged in turn at an object stage 122.

In a further embodiment of the combination apparatus 200, the holding device 114 may be embodied as an object receiving device, for example in the form of a manipulator and/or a gripper for holding the object receiving container 125. Then, the holding device 114 may have a movable embodiment, for example as explained above and further below in respect of the object stage 122.

An adjustable or selectable aperture unit 306, a first electrode arrangement 307 and a second electrode arrangement 308 may be arranged above the second objective lens 304 (i.e., in the direction of the ion beam generator 301), wherein the first electrode arrangement 307 and the second electrode arrangement 308 may be embodied as scanning electrodes. The second particle beam may be scanned over the surface of the object by means of the first electrode arrangement 307 and the second electrode arrangement 308, with the first electrode arrangement 307 acting in a first direction and the second electrode arrangement 308 acting in a second direction, which may be counter to the first direction. Thus, scanning may be carried out in an x-direction, for example. The scanning in a y-direction perpendicular thereto may be brought about by further electrodes (not illustrated), which may be rotated by 90°, at the first electrode arrangement 307 and at the second electrode arrangement 308.

As explained above, the holding device 114 may be arranged at the object stage 122. In the embodiment shown in FIG. 2, too, the object stage 122 may be embodied to be movable in three directions arranged perpendicular to one another, specifically in an x-direction (first stage axis), in a y-direction (second stage axis) and in a z-direction (third stage axis). Moreover, the object stage 122 may be rotated about two rotation axes which may be arranged perpendicular to one another (stage rotation axes).

The distances illustrated in FIG. 2 between the individual units of the combination apparatus 200 are illustrated in exaggerated fashion in order to better illustrate the individual units of the combination apparatus 200.

Arranged at the sample chamber 201 may be a radiation detector 500, which may be used to detect interaction radiation, for example x-ray radiation and/or cathodoluminescence light. The radiation detector 500 may be connected to a control unit 123, which may have a monitor 124. The control unit 123 may process detection signals that may be generated by the first detector 116, the second detector 117 (not illustrated in FIG. 2), the chamber detector 119, the third detector 121 and/or the radiation detector 500 and displays said detection signals in the form of images on the monitor 124.

The control unit 123 may comprise a database 126, in which the control unit 123 may store data and/or from which data may be loaded onto a processor of the control unit 123.

Arranged at the holding device 114 may be a cooling and/or heating device 127, which may be used for cooling and/or heating the holding device 114, the object receiving container 125 and/or the object. This is discussed in more detail further below.

To determine a temperature of the object, a temperature of the holding device 114, a temperature of the object receiving container 125 and/or a temperature of the object stage 122, a temperature measuring unit 128 may be arranged in the sample chamber 201. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the combination apparatus 200 may comprise the processor or may be embodied as a processor. A computer program product that controls the combination apparatus 200 in such a way that the method according to embodiments of the system described herein is carried out may be loaded onto the processor. This is discussed in more detail further below.

Figure 3:
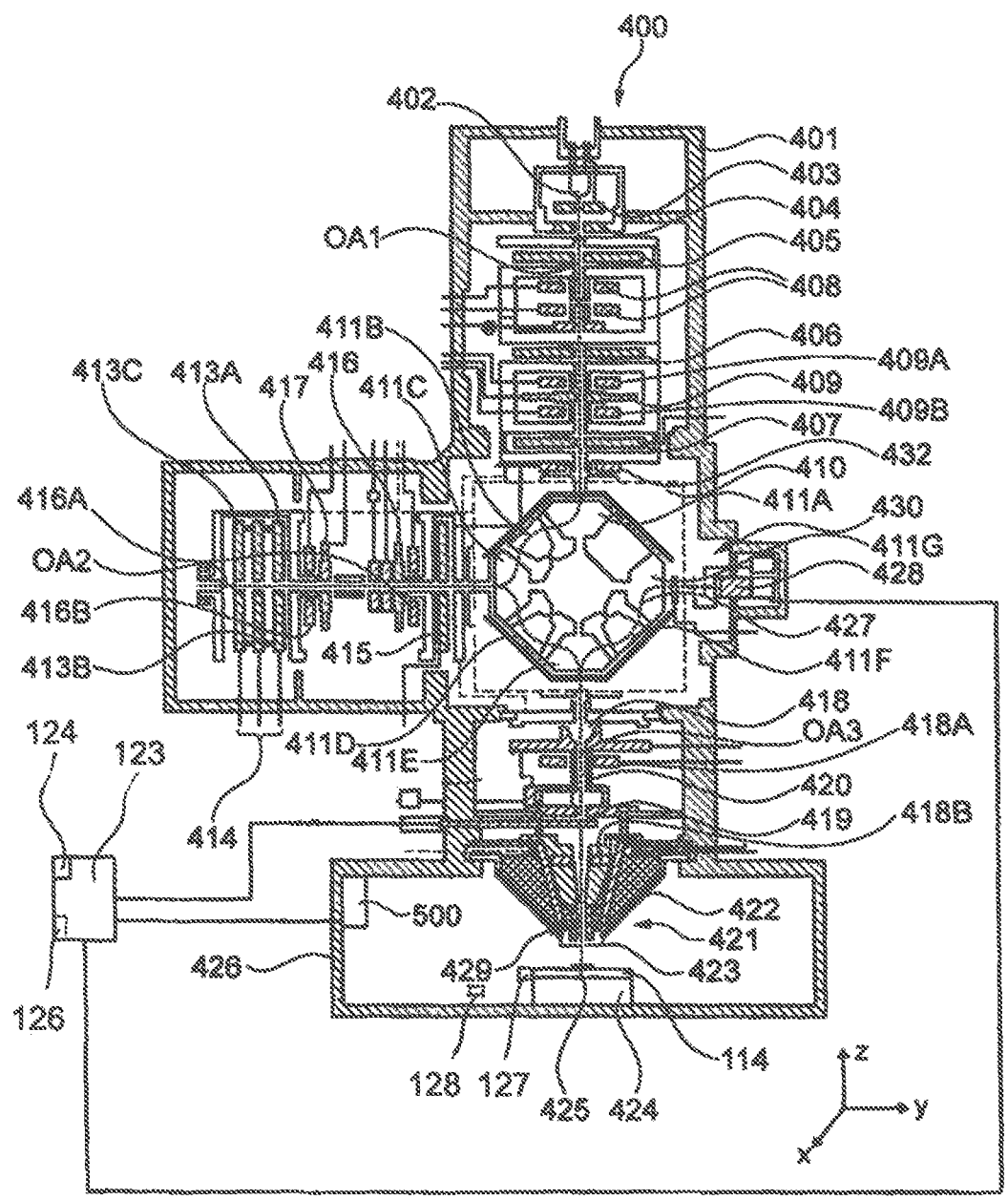
FIG. 3 shows a third embodiment of a particle beam apparatus of the system described herein.

FIG. 3 is a schematic illustration of a further embodiment of a particle beam apparatus according to embodiments of the system described herein. This embodiment of the particle beam apparatus may be provided with the reference sign 400 and may comprise a mirror corrector for correcting e.g.

chromatic and/or spherical aberrations. The particle beam apparatus 400 may comprise a particle beam column 401, which may be embodied as an electron beam column and which substantially corresponds to an electron beam column of a corrected SEM. However, the particle beam apparatus 400 is not restricted to an SEM with a mirror corrector. Rather, the particle beam apparatus may comprise any type of corrector units.

The particle beam column 401 may comprise a particle beam generator in the form of an electron source 402 (cathode), an extraction electrode 403, and an anode 404. By way of example, the electron source 402 is embodied as a thermal field emitter. Electrons emerging from the electron source 402 may be accelerated to the anode 404 on account of a potential difference between the electron source 402 and the anode 404. Accordingly, a particle beam in the form of an electron beam may be formed along a first optical axis OA1.

The particle beam may be guided along a beam path, which corresponds to the first optical axis OA1, after the particle beam has emerged from the electron source 402. A first electatic lens 405, a second electrostatic lens 406, and a third electrostatic lens 407 may be used to guide the particle beam.

Furthermore, the particle beam may be set along the beam path using a beam guiding device. The beam guiding device of this embodiment may comprise a source setting unit with two magnetic deflection units 408 arranged along the first optical axis OA1. Moreover, the particle beam apparatus 400 may comprise electrostatic beam deflection units. A first electrostatic beam deflection unit 409, which also may be embodied as a quadrupole in a further embodiment, may be arranged between the second electrostatic lens 406 and the third electrostatic lens 407. The first electrostatic beam deflection unit 409 likewise may be arranged downstream of the magnetic deflection units 408. A first multi-pole unit 409A in the form of a first magnetic deflection unit may be arranged at one side of the first electrostatic beam deflection unit 409. Moreover, a second multi-pole unit 409B in the form of a second magnetic deflection unit may be arranged at the other side of the first electrostatic beam deflection unit 409. The first electrostatic beam deflection unit 409, the first multi-pole unit 409A, and the second multi-pole unit 409B may be set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B may interact like a Wien filter. A further magnetic deflection element 432 may be arranged at the entrance to the beam deflection device 410.

The beam deflection device 410 may be used as a particle beam deflector, which deflects the particle beam in a specific manner. The beam deflection device 410 may comprise a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and said particle beam may be deflected by the beam deflection device 410 in the direction of a second optical axis OA2. The beam deflection may be performed by means of the first magnetic sector 411A, by means of the second magnetic sector 411B and by means of the third magnetic sector 411C through an angle of 30° to 120°. The second optical axis OA2 may be oriented at the same angle with respect to the first optical axis OA1. The beam deflection device 410 also may deflect the particle beam which may be guided along the second optical axis OA2, to be precise in the direction of a third optical axis OA3. The beam deflection may be provided by the third magnetic sector 411C, the fourth magnetic sector 411D, and the fifth magnetic sector 411E. In the embodiment in FIG. 3, the deflection with respect to the second optical axis OA2 and with respect to the third optical axis OA3 may be provided by deflection of the particle beam at an angle of 90°. Hence, the third optical axis OA3 extends coaxially with respect to the first optical axis OA1. However, reference is made to the fact that the particle beam apparatus 400 according to embodiments of the system described herein described here is not restricted to deflection angles of 90°. Rather, any suitable deflection angle may be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam may be guided along the second optical axis OA2. The particle beam may be guided to an electrostatic mirror 414 and may travel on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 may comprise a first mirror electrode 413A, a second mirror electrode 413B, and a third mirror electrode 413C. Electrons of the particle beam which are reflected back at the electrostatic mirror 414 once again may travel along the second optical axis OA2 and re-enter the beam deflection device 410. Then, they may be deflected to the third optical axis OA3 by the third magnetic sector 411C, the fourth magnetic sector 411D, and the fifth magnetic sector 411E.

The electrons of the particle beam may emerge from the beam deflection device 410 and said electrons may be guided along the third optical axis OA3 to an object receiving container 425, at which an object to be examined may be arranged. The object receiving container 425 may be arranged at a holding device 114 in turn. On the path to the object, the particle beam may be guided to a fifth electrostatic lens 418, a beam guiding tube 420, a fifth multi-pole unit 418A, a sixth multi-pole unit 418B, and an objective lens 421. The fifth electrostatic lens 418 may be an electrostatic immersion lens. By way of the fifth electrostatic lens 418, the particle beam may be decelerated or accelerated to an electric potential of the beam guiding tube 420.

By means of the objective lens 421, the particle beam may be focused into a focal plane in which the object is arranged. The holding device 114 may be arranged at a movable object stage 424. The movable object stage 424 may be arranged in a sample chamber 426 of the particle beam apparatus 400. The object stage 424 may be embodied to be movable in three directions arranged perpendicular to one another, specifically in an x-direction (first stage axis), in a y-direction (second stage axis), and in a z-direction (third stage axis). Moreover, the object stage 424 may be rotated about two rotation axes which may be arranged perpendicular to one another (stage rotation axes).

In a further embodiment of the particle beam apparatus 400, the holding device 114 may be embodied as an object receiving device, for example in the form of a manipulator and/or a gripper for holding the object receiving container 425. Then, the holding device 114 may have a movable embodiment, for example as explained above and further below in respect of the object stage 424.

The sample chamber 426 may be under vacuum. For the purposes of producing the vacuum, a pump (not illustrated) may be arranged at the sample chamber 426. In the embodiment illustrated in FIG. 3, the sample chamber 426 may be operated in a first pressure range or in a second pressure range. The first pressure range may comprise only pressures of less than or equal to $10^{-3}$ hPa, and the second pressure range may comprise only pressures of greater than $10^{-3}$ hPa. To ensure said pressure ranges, the sample chamber 426 may be vacuum-sealed.

The objective lens 421 may be embodied as a combination of a magnetic lens 422 and a sixth electrostatic lens 423. The end of the beam guiding tube 420 further may be an electrode of an electrostatic lens. After emerging from the beam guiding tube 420, particles of the particle beam apparatus 400 may be decelerated to a potential of the object. The objective lens 421 may not be restricted to a combination of the magnetic lens 422 and the sixth electrostatic lens 423. Rather, the objective lens 421 may assume any suitable form. By way of example, the objective lens 421 also may be embodied as a purely magnetic lens or as a purely electrostatic lens.

The particle beam which is focused onto the object may interact with the object. Interaction particles may be generated. In particular, secondary electrons may be emitted from the object or backscattered electrons may be backscattered at the object. The secondary electrons or the backscattered electrons may be accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 may comprise a first analysis detector 419, which may be arranged between the beam deflection device 410 and the objective lens 421 along the beam path. Secondary electrons traveling in directions oriented at a large angle with respect to the third optical axis OA3 may be detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—may enter the beam deflection device 410 and be deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 may generate detection signals which may be largely generated by emitted secondary electrons. The detection signals which are generated by the first analysis detector 419 may be guided to a control unit 123 and may be used to obtain information about the properties of the interaction region of the focused particle beam with the object. In particular, the focused particle beam may be scanned over the object using a scanning device 429. By means of the detection signals generated by the first analysis detector 419, an image of the scanned region of the object then may be generated and displayed on a display unit. The display unit is, for example, a monitor 124 that may be arranged at the control unit 123.

The second analysis detector 428 also may be connected to the control unit 123. Detection signals of the second analysis detector 428 may be passed to the control unit 123 and used to generate an image of the scanned region of the object and to display it on a display unit. The display unit is, for example, the monitor 124 that may be arranged at the control unit 123.

Arranged at the sample chamber 426 may be a radiation detector 500, which may be used to detect interaction radiation, for example x-ray radiation and/or cathodoluminescence light. The radiation detector 500 may be connected to the control unit 123, which may have the monitor 124. The control unit 123 may process detection signals of the radiation detector 500 and displays them in the form of images on the monitor 124.

The control unit 123 may comprise a database 126, in which the control unit 123 may store data and/or from which data may be loaded onto a processor of the control unit 123.

Arranged at the holding device 114 may be a cooling and/or heating device 127, which may be used for cooling and/or heating the holding device 114, the object receiving container 425 and/or the object. This is discussed in more detail further below.

To determine a temperature of the object, a temperature of the holding device 114, a temperature of the object receiving container 125 and/or a temperature of the object stage 424, a temperature measuring unit 128 may be arranged in the sample chamber 426. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the particle beam apparatus 400 may comprise the processor or may be embodied as a processor. A computer program product that controls the particle beam apparatus 400 in such a way that the method according to embodiments of the system described herein is carried out may be loaded onto the processor. This is discussed in more detail further below.

Figure 4:
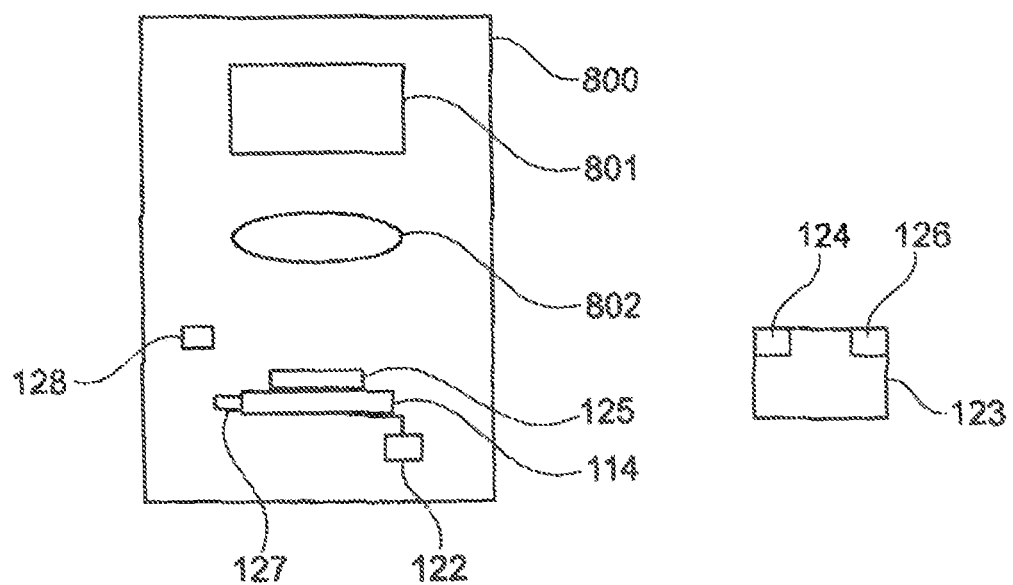
FIG. 4 shows a schematic illustration of a light microscope, according to an embodiment of the system described herein.

FIG. 4 shows a schematic illustration of a light microscope 800. The light microscope 800 may comprise a light source 801 for generating light and an optical unit 802 in the form of an objective for guiding the light to an object, which may be arranged on an object receiving container 125. Further, the light microscope 800 may be provided with a holding device 114 for holding the object receiving container 125. Moreover, the light microscope 800 may be embodied with a movably embodied object stage 122, arranged at which may be the holding device 114 and hence also the object receiving container 125.

The object stage 122 of the light microscope 800 may be embodied to be movable, for example, along a first translation axis (in particular an x-axis), along a second translation axis (in particular a y-axis), and along a third translation axis (in particular a z-axis). By way of example, the first translation axis, the second translation axis, and the third translation axis may be oriented perpendicular to one another. Further, the object stage 122 may be for example embodied to be rotatable about a first axis of rotation and about a second axis of rotation, which may be aligned perpendicular to the first axis of rotation. In one embodiment of the light microscope 800, a respective motor may be provided for each of the aforementioned axes, said motor facilitating the movement along the corresponding axis.

In a further embodiment of the light microscope 800, the holding device 114 may be embodied as an object receiving device, for example in the form of a manipulator and/or a gripper for holding the object receiving container 125. Then, the holding device 114 may have a movable embodiment, for example as explained above and further below in respect of the object stage 122.

The light microscope 800 may comprise a control unit 123, which may be provided with a monitor 124 on which images of the object recorded with the light microscope 800 may be displayable.

The control unit 123 may comprise a database 126, in which the control unit 123 may store data and/or from which data may be loaded onto a processor of the control unit 123.

Arranged at the holding device 114 may be a cooling and/or heating device 127, which may be used for cooling and/or heating the holding device 114, the object receiving container 125 and/or the object. This is discussed in more detail further below.

To determine a temperature of the object, a temperature of the holding device 114 and/or a temperature of the object stage 122, the light microscope 800 may comprise a temperature measuring unit 128. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

The control unit 123 of the light microscope 800 may comprise the processor or may be embodied as a processor. A computer program product that controls the light microscope 800 in such a way that the method according to embodiments of the system described herein is carried out may be loaded onto the processor. This is discussed in more detail further below.

Figure 4A:
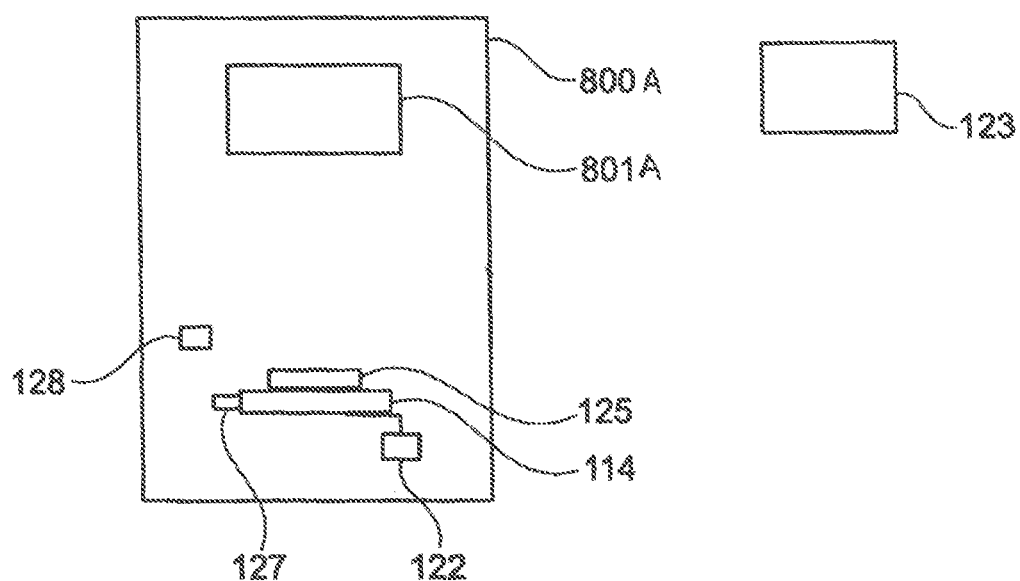
FIG. 4A shows a schematic illustration of an apparatus for processing an object, according to an embodiment of the system described herein.

FIG. 4A shows a schematic illustration of an apparatus 800A for processing an object. The apparatus 800A for processing an object may comprise a processing device 801A for processing the object. By way of example, the processing device 801A may be embodied as a mechanical cutting device and/or as a laser cutting device and/or as a device for electron beam-induced deposition of layers on the object, for example using a gas, and/or as a device for ion beam-induced deposition of layers on the object, for example using a gas, and/or as a sputtering apparatus. The object may be arranged at an object receiving container 125. Further, the apparatus 800A for processing an object may be provided with a holding device 114 for holding the object receiving container 125. Moreover, the apparatus 800A for processing an object may be embodied with a movably embodied object stage 122, arranged at which may be the holding device 114 and hence also the object receiving container 125.

The object stage 122 of the apparatus 800A for processing an object may be embodied to be movable, for example along a first translation axis (in particular an x-axis), along a second translation axis (in particular a y-axis) and along a third translation axis (in particular a z-axis). By way of example, the first translation axis, the second translation axis, and the third translation axis may be oriented perpendicular to one another. Further, the object stage 122 may be for example embodied to be rotatable about a first axis of rotation and about a second axis of rotation, which may be aligned perpendicular to the first axis of rotation. In one embodiment of the apparatus 800A for processing an object, each of the aforementioned axes is respectively associated with a motor which facilitates the movement along the corresponding axis.

In a further embodiment of the apparatus 800A for processing an object, the holding device 114 may be embodied as an object receiving device, for example in the form of a manipulator and/or a gripper for holding the object receiving container 125. Then, the holding device 114 may have a movable embodiment, for example as explained above and further below in respect of the object stage 122.

Arranged at the holding device 114 may be a cooling and/or heating device 127, which may be used for cooling and/or heating the holding device 114, the object receiving container 125 and/or the object. This is discussed in more detail further below.

To determine a temperature of the object, a temperature of the holding device 114 and/or a temperature of the object stage 122, the apparatus 800A for processing an object may comprise a temperature measuring unit 128. By way of example, the temperature measuring unit 128 may be embodied as an infrared measuring apparatus or as a semiconductor temperature sensor. However, the system described herein is not restricted to the use of such temperature measuring units. Rather, any temperature measuring unit which is suitable for the system described herein may be used as temperature measuring unit.

A control unit 123 of the apparatus 800A for processing an object may comprise a processor or may be embodied as a processor. Loaded onto the processor may be a computer program product which controls the apparatus 800A for processing an object in such a way that the method according to embodiments of the system described herein may be carried out. This is discussed in more detail further below.

Figure 5:
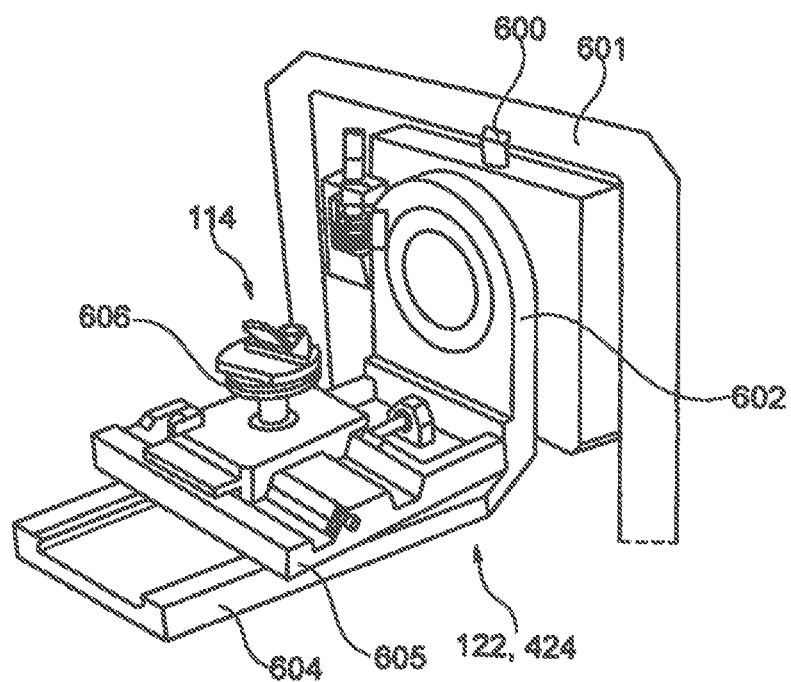
FIG. 5 shows a schematic illustration of an embodiment of an object stage with a movable embodiment for a particle beam apparatus and/or a light microscope and/or an apparatus for processing the object, according to an embodiment of the system described herein.

Now, in the following, the object stage 122, 424 of the above-discussed particle beam apparatuses 100, 200 and 400, of the light microscope 800 and of the apparatus 800A for processing an object is discussed in more detail. The object stage 122, 424 may be embodied as a movable object stage, which is illustrated schematically in FIGS. 5 and 6. Reference is made to the fact that the system described herein is not restricted to the object stage 122, 424 described here. Rather, the system described herein may include any movable object stage that is suitable for the system described herein. In a further embodiment, the holding device 114 may be embodied as an object receiving device, for example in the form of a manipulator and/or a gripper for holding the object receiving container 125. Then, the holding device 114 may have a movable embodiment, for example as explained above and further below in respect of the object stage 122, 424.

The holding device 114 may be arranged at the object stage 122, 424, either directly or using a transportation device, with the object receiving container 125, 425 with the object being arranged, in turn, in the holding device 114. The object stage 122, 424 may have movement elements that ensure a movement of the object stage 122, 424 in such a way that a region of interest on the object may be examined, for example, by means of a particle beam and/or a light beam. The movement elements are illustrated schematically in FIGS. 5 and 6 and are explained below.

The object stage 122, 424 may have a first movement element 600, which may be arranged, for example, at a housing 601 of the sample chamber 120, 201 or 426, in which the object stage 122, 424 may be arranged in turn. The first movement element 600 may enable a movement of the object stage 122, 424 along the z-axis (third stage axis). Further, a second movement element 602 may be provided.

The second movement element 602 may enable a rotation of the object stage 122, 424 about a first stage rotation axis 603, which also may be referred to as a tilt axis. This second movement element 602 may serve to tilt an object arranged at the object receiving container 125, 425 about the first stage rotation axis 603, wherein the object receiving container 125, 425 may be arranged at the holding device 114.

Arranged at the second movement element 602, in turn, may be a third movement element 604 that may be embodied as a guide for a slide and that may ensure that the object stage 122, 424 may be movable in the x-direction (first stage axis). The aforementioned slide may be a further movement element in turn, namely a fourth movement element 605. The fourth movement element 605 may be embodied in such a way that the object stage 122, 424 is movable in the y-direction (second stage axis). To this end, the fourth movement element 605 may have a guide in which a further slide is guided, a holding device 114 with the object receiving container 125, 425 in turn being arranged at the latter.

The holding device 114 may be embodied, in turn, with a fifth movement element 606 that facilitates a rotation of the holding device 114 and hence also the object receiving container 125, 425 about a second stage rotation axis 607. The second stage rotation axis 607 may be oriented perpendicular to the first stage rotation axis 603.

On account of the above-described arrangement, the object stage 122, 424 of the embodiment discussed here may have the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further embodiment (not illustrated), further movement elements may be arranged at the object stage 122, 424 such that movements along further translational axes and/or about further rotation axes may be made possible.

Figure 6:
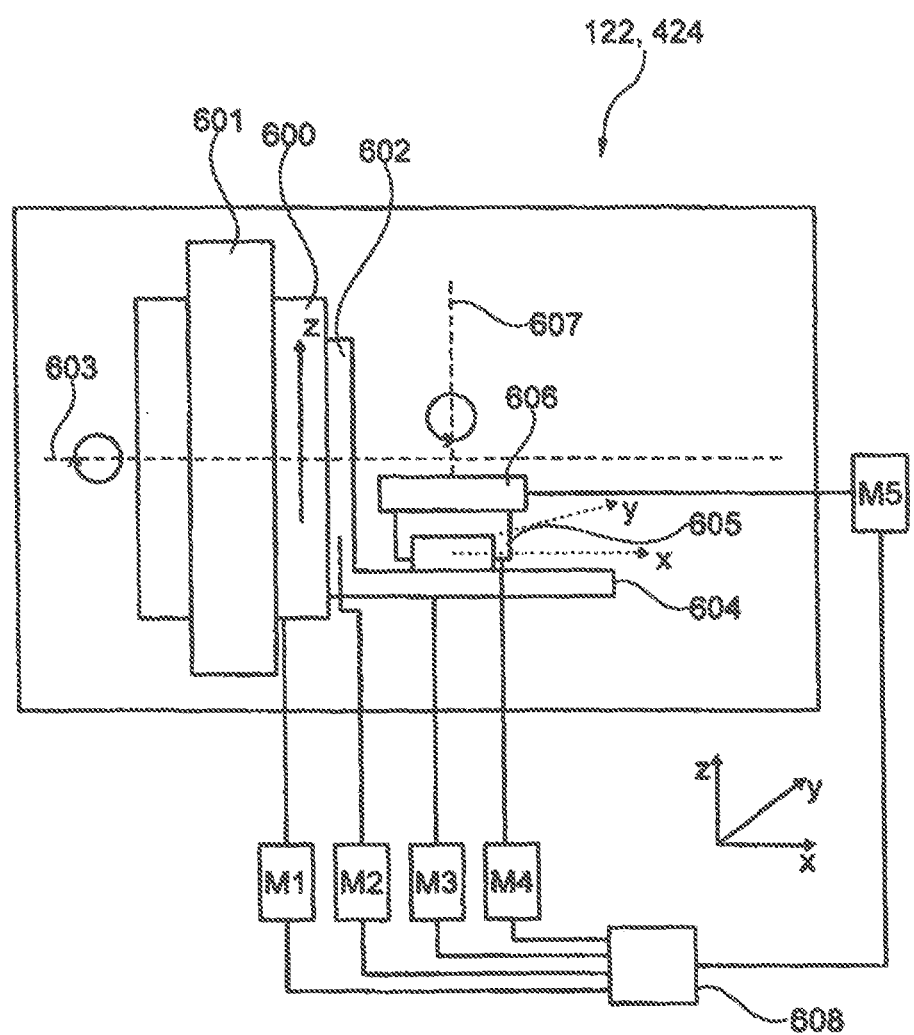
FIG. 6 shows a further schematic illustration of the object stage according to FIG. 5, according to an embodiment of the system described herein.

It should be clear from FIG. 6 that each of the aforementioned movement elements may be connected to a drive unit in the form of a motor M1 to M5. Thus, the first movement element 600 may be connected to a first drive unit M1 and may be driven on account of a driving force that may be provided by the first drive unit M1. The second movement element 602 may be connected to a second drive unit M2, which drives the second movement element 602. The third movement element 604 may be connected, in turn, to a third drive unit M3. The third drive unit M3 provides a driving force for driving the third movement element 604. The fourth movement element 605 may be connected to a fourth drive unit M4, wherein the fourth drive unit M4 drives the fourth movement element 605. Furthermore, the fifth movement element 606 may be connected to a fifth drive unit M5. The fifth drive unit M5 provides a driving force that drives the fifth movement element 606.

The aforementioned drive units M1 to M5 may be embodied as stepper motors, for example, and may be controlled by a control unit 608 and may be each supplied with a supply current by the control unit 608 (cf. FIG. 6). It is explicitly pointed out that the system described herein is not restricted to the movement by means of stepper motors. Rather, any drive units may be used as drive units, for example brushless motors. By supplying the supply current to the drive units M1 to M5, the drive units M1 to M5 may be controlled in such a way that the object stage 122, 424 may be moved to a desired position, for example in the sample chamber 120, 201, 426. The object stage 122, 424 may be held in this desired position by means of the drive units M1 to M5. Expressed differently, the object stage 122, 424 should no longer move away from this desired position. This may be desirable, in particular for a good resolution and/or accurate imaging of an object arranged on the object stage 122, 424. When the drive units M1 to M5 are stopped, the amplitude of the supply current may be lowered to a specifiable holding amplitude for each of the drive units M1 to M5. The supply current with this holding amplitude also may be referred to as a holding current. When the supply current is at the holding current for each of the drive units M1 to M5, the object stage 122, 424 may remain at the desired position.

FIG. 7 shows an embodiment of the object receiving container 125. The object receiving container 125 may comprise a first container unit 129 and a second container unit 130. A first cavity 131 and a second cavity 132 may be arranged at the first container unit 129. The first cavity 131 may be embodied to receive a first object. Further, the second cavity 132 may be embodied to receive a second object.

Moreover, the object receiving container 125 may comprise a hinge device 134, which may be arranged both at the first container unit 129 and at the second container unit 130. The second container unit 130 may have a movable embodiment relative to the first container unit 129 on account of the hinge device 134. The second container unit 130 may be able to be brought into a first position and/or into a second position relative to the first container unit 129.

The first cavity 131 may comprise a first cavity opening 136 and a second cavity opening 138 (cf. FIGS. 7 and 9). The first cavity opening 136 and the second cavity opening 138 of the first cavity 131 delimit the first cavity 131. Further, the first cavity opening 136 and the second cavity opening 138 of the first cavity 131 may be arranged opposite one another. Moreover, the second cavity 132 may comprise a first cavity opening 137 and a second cavity opening 139 (cf. FIGS. 7 and 9). The first cavity opening 137 and the second cavity opening 139 of the second cavity 132 delimit the second cavity 132. Further, the first cavity opening 137 and the second cavity opening 139 of the second cavity 132 may be arranged opposite one another.

FIG. 8 shows the second position of the second container unit 130 relative to the first container unit 129. In the second position of the second container unit 130 relative to the first container unit 129, the first cavity opening 136 of the first cavity 131 and the first cavity opening 137 of the second cavity 132 may be arranged at the second container unit 130. Consequently, the second container unit 130 may cover the first cavity opening 136 of the first cavity 131 and the first cavity opening 137 of the second cavity 132 in the second position of the second container unit 130 relative to the first container unit 129. Then, the first object arranged in the first cavity 131 may not be accessible through the first cavity opening 136 of the first cavity 131. Further, the second object arranged in the second cavity 132 then may not be accessible through the first cavity opening 137 of the second cavity 132. FIG. 7 shows the first position of the second container unit 130 relative to the first container unit 129. In the first position of the second container unit 130 relative to the first container unit 129, the first cavity opening 136 of the first cavity 131 and the first cavity opening 137 of the second cavity 132 may be freely accessible at the first container unit 129. Then, the first object arranged in the first cavity 131 may be accessible through the first cavity opening 136 of the first cavity 131. Further, the second object arranged in the second cavity 132 then may be accessible through the first cavity opening 137 of the second cavity 132.

In one embodiment of the object receiving container 125, a covering device 140 for covering the second cavity opening 138 of the first cavity 131 and the second cavity opening 139 of the second cavity 132 is arranged at the second cavity opening 138 of the first cavity 131 and at the second cavity opening 139 of the second cavity 132 (cf. FIGS. 7 and 9). The covering device 140 may be embodied as a slider device and arranged in a receptacle at the first container unit 129 in such a way that the covering device 140 is displaceable relative to the second cavity opening 138 of the first cavity 131 and to the second cavity opening 139 of the second cavity 132. In this way, the covering device 140 may be able to be brought into a covering position (cf. FIG. 7) and an exposing position (cf. FIG. 9). In the covering position, the covering device 140 may cover the second cavity opening 138 of the first cavity 131 and the second cavity opening 139 of the second cavity 132. Expressed differently, the covering device 140 seals the first cavity 131 and the second cavity 132 in the region of the second cavity opening 138 of the first cavity 131 and in the region of the second cavity opening 139 of the second cavity 132 in the covering position. In the exposing position, the covering device 140 does not seal the first cavity 131 and the second cavity 132 in the region of the second cavity opening 138 of the first cavity 131 and in the region of the second cavity opening 139 of the second cavity 132. Then, the first object arranged in the first cavity 131 may be accessible through the second cavity opening 138 of the first cavity 131. Further, the second object arranged in the second cavity 132 then may be accessible through the second cavity opening 139 of the second cavity 132. The aforementioned embodiments may be advantageous if examinations of the first object and/or the second object are performed, within the scope of which a particle beam may be transmitted through the first object and/or the second object. The transmitted particles of the particle beam then may be detected. Interaction particles which arise on account of an interaction of the particle beam with the first object may emerge at a side of the first object which may be arranged at the second cavity opening 138 of the first cavity 131. Furthermore, interaction particles which arise on account of an interaction of the particle beam with the second object may emerge at a side of the second object which may be arranged at the second cavity opening 139 of the second cavity 132. The interaction particles and/or the transmitted particles of the particle beam then may be detected using a detector, for example the third detector 121.

Consequently, in the above-described embodiment, firstly, the first cavity opening 136 of the first cavity 131 and the first cavity opening 137 of the second cavity 132 and, secondly, the second cavity opening 138 of the first cavity 131 and the second cavity opening 139 of the second cavity 132 may be covered by different units. The first cavity openings 136, 137 may be covered by the second container unit 130. By contrast, the second cavity openings 138, 139 may be covered by the covering device 140.

As illustrated in FIGS. 7 to 9, the object receiving container 125 may comprise a fastening device 133, which may be arranged at the first container unit 129. In addition or as an alternative thereto, the fastening device 133 may be arranged at the second container unit 130. The fastening device 133 may serve to arrange the object receiving container 125 at the holding device 114, as yet to be explained in more detail below.

In the embodiment of the object receiving container 125 illustrated in FIGS. 7 to 9, the fastening device 133 may be embodied as a spring device. The fastening device 133 may have a first spring end 141 and a second spring end 142. The first spring end 141 and the second spring end 142 may be arranged at a distance from one another. Further, the first spring end 141 may be embodied so as to be movable relative to the second spring end 142. Expressed differently, the first spring end 141 and/or the second spring end 142 may have a movable embodiment. The first spring end 141 may have a first engagement opening 143 for the engagement of an actuation tool. Moreover, the second spring end 142 may have a second engagement opening 144 for the engagement of the actuation tool. This may ensure a simple operation of the fastening device 133 in the form of the spring device, and so the object receiving container 125 may be able to be easily mounted on the holding device 114 and may be easily detachable from the holding device 114 again, as will be explained in more detail below.

In a further embodiment of the object receiving container 125, the fastening device 133 may comprise at least one snap ring and/or may be embodied as a snap ring. In an even further embodiment of the object receiving container 125, the fastening device 133 may comprise a clamping device or may be embodied as a clamping device. In particular, the fastening device 133 may have a first clamping part and a second clamping part. In addition or as an alternative thereto, the fastening device 133 may comprise a screw and/or an eccentric disk, wherein the screw and/or the eccentric disk may be used to clamp the object receiving container 125 against the holding device 114.

In the embodiment of the object receiving container 125 illustrated in FIGS. 7 to 9, the first container unit 129 may have a first surface 145, wherein the first surface 145 may be arranged in a first plane. Further, the second container unit 130 may have a second surface 146, wherein the second surface 146 may be arranged in a second plane. As illustrated in FIG. 8, the first surface 145 of the first container unit 129 rests against the second surface 146 of the second container unit 130 in the second position of the second container unit 130 relative to the first container unit 129, and so the first cavity 131 arranged at the first container unit 129 and the second cavity 132 may be covered by the second surface 146 of the second container unit 130. FIG. 7 shows the first position of the second container unit 130 relative to the first container unit 129. In the first position, the first surface 145 of the first container unit 129 may be arranged with respect to the second surface 146 of the second container unit 130 in such a way that the first plane is aligned with respect to the second plane as follows: (i) the first plane is aligned parallel to the second plane or (ii) the first plane is identical to the second plane or (iii) the first plane is aligned at an angle of more than 5° with respect to the second plane.

Figure 10:
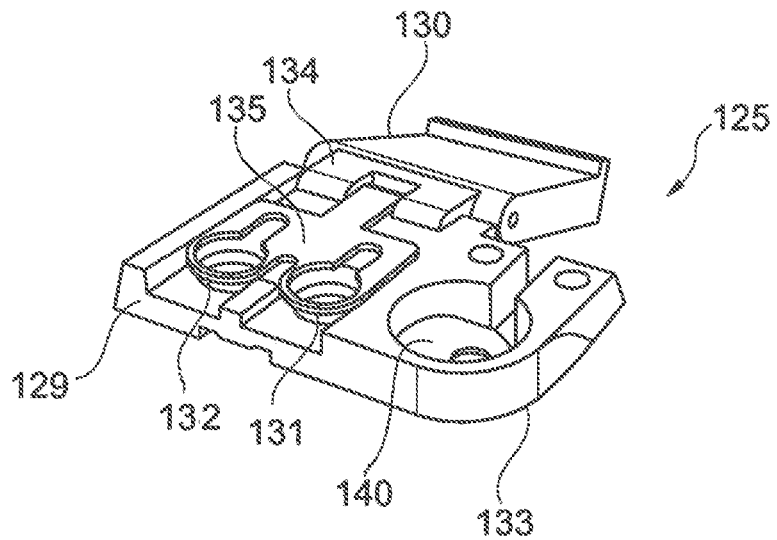
FIG. 10 shows a fourth schematic illustration of the object receiving container according to FIG. 7, according to an embodiment of the system described herein.

FIG. 10 shows a further perspective view of the object receiving container 125 having the features already discussed further above. Further, FIG. 10 shows a clamping unit 135, which is likewise illustrated in FIGS. 7 and 9. The function of the clamping unit 135 will be discussed in more detail below.

Figure 11:
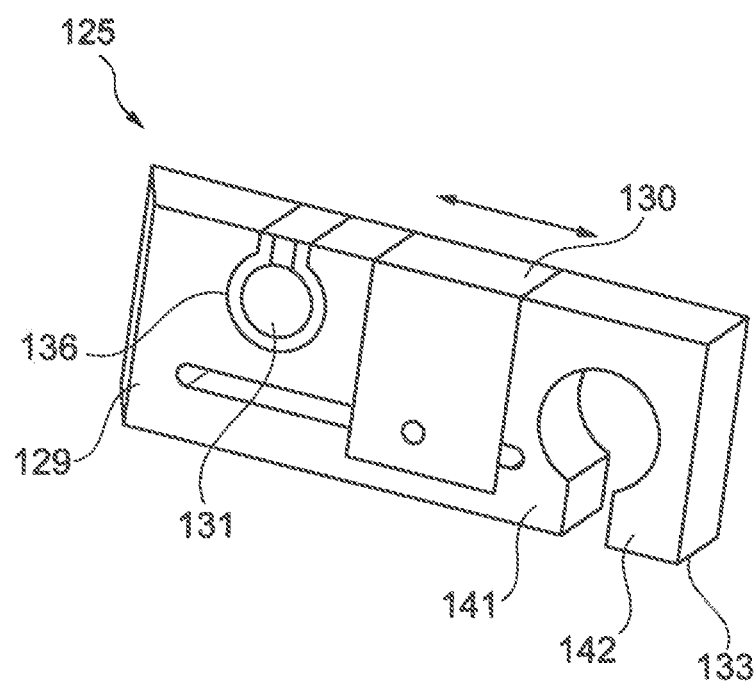
FIG. 11 shows a schematic illustration of a further object receiving container, according to an embodiment of the system described herein.

FIG. 11 shows a further embodiment of the object receiving container 125. This embodiment of the object receiving container 125 also may comprise a first container unit 129 and a second container unit 130. A first cavity 131 may be arranged at the first container unit 129. The first cavity 131 may be embodied to receive a first object. The first cavity 131 may have a first cavity opening 136. The first cavity opening 136 delimits the first cavity 131.

In the embodiment of the object receiving container 125 illustrated in FIG. 11, the second container unit 130 may be embodied as a displacing device such that the second container unit 130 is displaceable into a first position and/or into a second position relative to the first container unit 129. Expressed differently, the first container unit 129 and/or the second container unit 130 may be displaceable such that the second container unit 130 may be arranged in the first position and/or in the second position relative to the first container unit 129. The second container unit 130 may cover the first cavity 131 arranged at the first container unit 129 when the second container unit 130 is in the second position relative to the first container unit 129. If a plurality of cavities are arranged at the first container unit 129, the second container unit 130 may cover the plurality of cavities in the second position of the second container unit 130 relative to the first container unit 129. FIG. 11 shows the first position of the second container unit 130 relative to the first container unit 129. The first cavity 131 and hence the first object arranged in the first cavity 131 may be accessible in the first position of the second container unit 130 relative to the first container unit 129. Therefore, the first object may be examined, analyzed and/or processed. If a plurality of cavities are arranged at the first container unit 129, then the plurality of cavities and hence the objects arranged in the plurality of cavities may be accessible in the first position of the second container unit 130 relative to the first container unit 129.

The embodiment of the object receiving container 125 illustrated in FIG. 11 may comprise a fastening device 133, which may be arranged at the first container unit 129. The fastening device 133 may be embodied as a spring device. The fastening device 133 of this embodiment, too, may have a first spring end 141 and a second spring end 142. The first spring end 141 and the second spring end 142 may be arranged at a distance from one another. Further, the first spring end 141 may be embodied so as to be movable relative to the second spring end 142. Expressed differently, the first spring end 141 and/or the second spring end 142 may have a movable embodiment. Due to the fastening device 133 in the form of the spring device it may be ensured that the object receiving container 125 is able to be easily mounted on the holding device 114 and is easily detachable from the holding device 114 again, as will be explained in more detail below.

Figure 12:
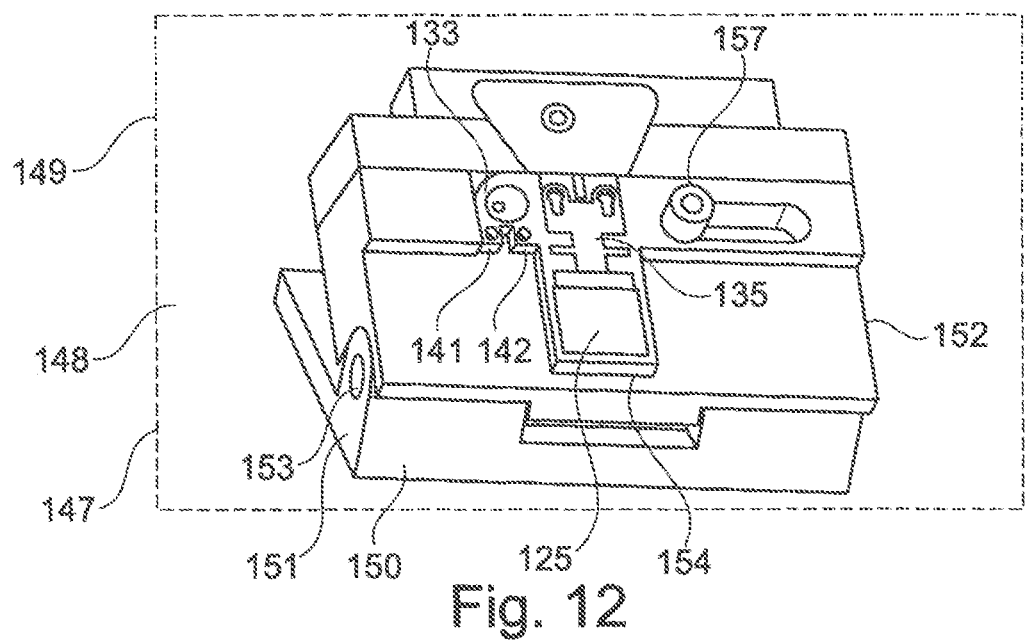
FIG. 12 shows a first schematic illustration of a mounting device for an object receiving container, according to an embodiment of the system described herein.

FIG. 12 shows an embodiment of a mounting device 147, by means of which, for example, the first object may be arranged in the first cavity 131 and the second object may be arranged in the second cavity 132 of the object receiving container 125 as per FIGS. 7 to 10. The mounting device 147 may have an interior 148, which may be surrounded by an insulated wall 149. A holder 150 for the object receiving container 125 may be arranged in the interior 148. The holder 150 may comprise a first holder part 151 and a second holder part 152, which may be interconnected by way of a hinge 153. The first holder part 151 may be positioned relative to the second holder part 152 in order to ensure that it is easy to mount the first object in the first cavity 131 and the second object in the second cavity 132 of the object receiving container 125.

The object receiving container 125 may be arranged in a receptacle 154 of the holder 150 in order to mount the first object in the first cavity 131 and the second object in the second cavity 132 of the object receiving container 125. The object receiving container 125 may be fastened in the receptacle 154 by means of the fastening device 133. To this end, an actuation tool engages in the first engagement opening 143 of the first spring end 141 and in the second engagement opening 144 of the second spring end 142. Thereupon, the first spring end 141 and the second spring end 142 may be moved toward one another. Subsequently, the object receiving container 125 may be inserted in the receptacle 154. By removing the actuation tool from the first engagement opening 143 of the first spring end 141 and from the second engagement opening 144 of the second spring end 142, the first spring end 141 and the second spring end 142 move apart, and so an outer surface of the fastening device 133 rests against an inner surface of the receptacle 154. In this way, the object receiving container 125 may be held in clamping fashion in the receptacle 154.

Figure 13:
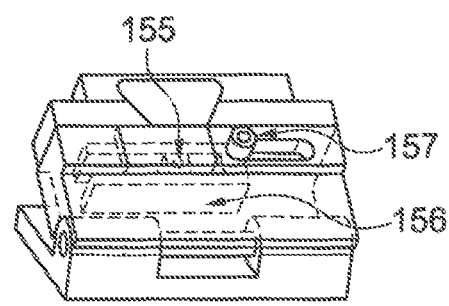
FIG. 13 shows a second schematic illustration of the mounting device according to FIG. 12, according to an embodiment of the system described herein.
Figure 14:
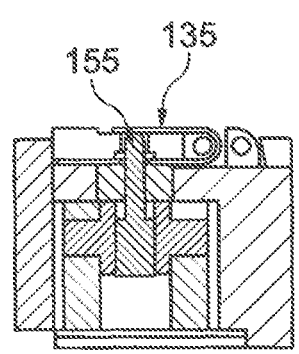
FIG. 14 shows a third schematic illustration of the mounting device according to FIG. 12 in a sectional view, according to an embodiment of the system described herein.

By filling the interior 148 of the mounting device 147, for example with liquid nitrogen or liquid helium, the object receiving container 125 may be cooled to cryo-temperatures, and so the first object may be mounted in the first cavity 131 and the second object may be mounted in the second cavity 132 of the object receiving container 125 under cryo-temperatures. To this end, the clamping unit 135, which may be embodied as a spring, may be raised by a rod-shaped unit 155 (cf. FIGS. 13 and 14), and so the first object is insertable into the first cavity 131 and the second object is insertable into the second cavity 132 of the object receiving container 125. Subsequently, the clamping unit 135 may be lowered by the rod-shaped unit 155, and so the first object is held in securely clamping fashion in the first cavity 131 and the second object is held in securely clamping fashion in the second cavity 132 of the object receiving container 125. By way of example, the rod-shaped unit 155 may be raised and lowered using a sliding-block guide 156. By moving an actuation unit 157, the rod-shaped unit 155 is, firstly, moved along the sliding-block guide 156 and, secondly, raised or lowered.

Figure 15:
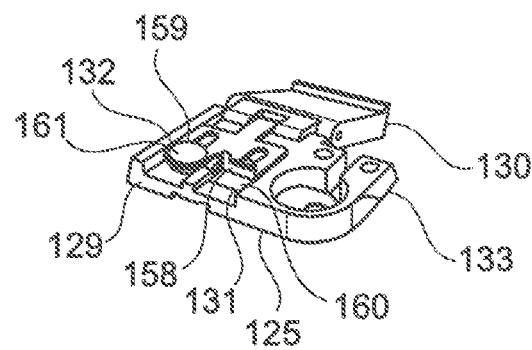
FIG. 15 shows a fifth schematic illustration of the object receiving container according to FIG. 7, according to an embodiment of the system described herein.

In a further embodiment, the first object may be initially arranged at a first holder and/or the second object may be arranged at a second holder. Subsequently, the first holder may be inserted together with the first object into the first cavity 131. Further, the second holder may be inserted together with the second object into the second cavity 132. Subsequently, the clamping unit 135 may be lowered by the rod-shaped unit 155, and so the first holder together with the first object is held in securely clamping fashion in the first cavity 131 and the second holder together with the second object is held in securely clamping fashion in the second cavity 132 of the object receiving container 125. This embodiment is illustrated in FIG. 15. FIG. 15 shows a further perspective illustration of the object receiving container 125, wherein a first holder 160 is arranged in the first cavity 131, with, in turn, a first object 158 being arranged at the first holder 160. A second holder 161 may be arranged in the second cavity 132, with, in turn, a second object 159 being arranged at the second holder 161. By way of example, the first holder 160 and/or the second holder 161 may be configured as commercially available TEM sample holders in the form of so-called grids or U-shaped embodied holders.

Figure 16:
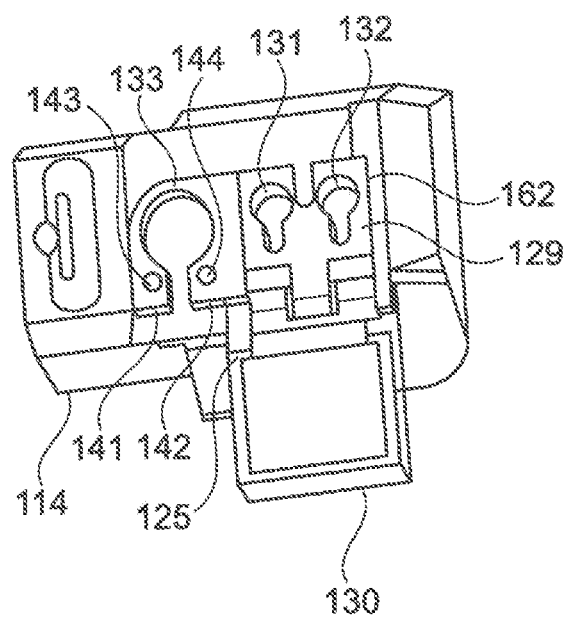
FIG. 16 shows a schematic illustration of a first embodiment of a holding device for the object receiving container of the system described herein.

FIG. 16 shows an embodiment of the holding device 114. By way of example, the holding device 114 may be an adapter device, which may be arranged at the object stage 122, 424 of the SEM 100, of the combination apparatus 200, of the particle beam apparatus 400 and/or of the light microscope 800. In addition or as an alternative thereto, the holding device 114 may be arranged at a receiving device of the apparatus 800A for processing an object, for example of a microtome, a laser cutting appliance and/or a polishing appliance.

In order to arrange the object receiving container 125 at the holding device 114, the object receiving container 125 may be arranged in a receptacle 162 of the holding device 114. To this end, the actuation tool engages in the first engagement opening 143 of the first spring end 141 and in the second engagement opening 144 of the second spring end 142. Thereupon, the first spring end 141 and the second spring end 142 may be moved toward one another. Subsequently, the object receiving container 125 may be inserted into the receptacle 162 of the holding device 114. By removing the actuation tool from the first engagement opening 143 of the first spring end 141 and from the second engagement opening 144 of the second spring end 142, the first spring end 141 and the second spring end 142 move apart, and so an outer surface of the fastening device 133 rests against an inner surface of the receptacle 162 of the holding device 114. In this way, the object receiving container 125 may be held in clamping fashion in the receptacle 162 of the holding device 114.

In a further embodiment of the holding device 114, the arrangement of the object receiving container 125 may be implemented by a differently configured fastening device 133. By way of example, the fastening device 133 may comprise at least one snap ring and/or may be embodied as a snap ring. In an even further embodiment, the fastening device 133 may comprise a clamping device or may be embodied as a clamping device. In particular, the fastening device 133 may have a first clamping part and a second clamping part. In addition or as an alternative thereto, the fastening device 133 may comprise a screw and/or an eccentric disk, wherein the screw and/or the eccentric disk may be used to clamp the object receiving container 125 against the holding device 114.

As already mentioned, the holding device 114 may have any suitable configuration which is necessary in order to be arranged, for example, at the object stage 122, 424 of the SEM 100, of the combination apparatus 200, of the particle beam apparatus 400 and/or of the light microscope 800. In addition or as an alternative thereto, the holding device 114 may be configured in such a way that the holding device 114 may be arranged at the apparatus 800A for processing an object, for example at a microtome, at a laser cutting appliance and/or at a polishing appliance.

Figure 17:
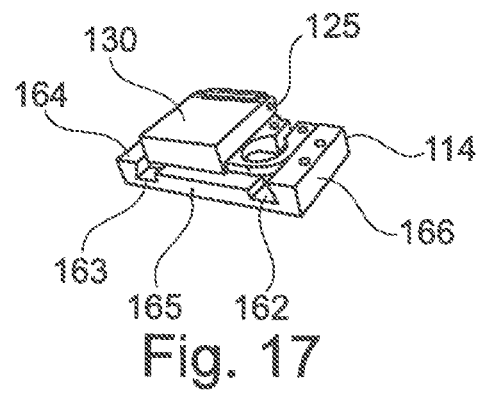
FIG. 17 shows a schematic illustration of a second embodiment of a holding device for the object receiving container of the system described herein.

FIG. 17 shows a further embodiment of the holding device 114. This embodiment of the holding device 114 may comprise a base plate 163, the sides of which may be delimited by a first strip 164, a second strip 165 and a third strip 166 in such a way that the first strip 164, the second strip 165 and the third strip 166 delimit the receptacle 162 of the holding device 114. The object receiving container 125 may be arranged in the receptacle 162. In FIG. 17, the second container unit 130 may be arranged in the second position relative to the first container unit 129.

Figure 18:
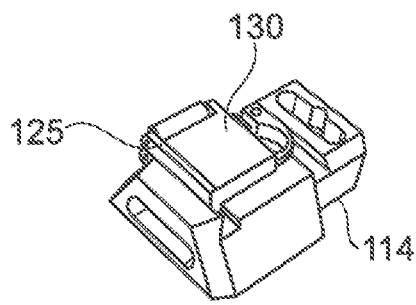
FIG. 18 shows a further schematic illustration of the first embodiment of a holding device for the object receiving container of the system described herein according to FIG. 16.

FIG. 18 shows the embodiment of the holding device 114 as per FIG. 16, but from a different perspective. Therefore, reference is initially made to the explanations above. Further, in FIG. 18, the second container unit 130 may be arranged in the second position relative to the first container unit 129.

Figure 19:
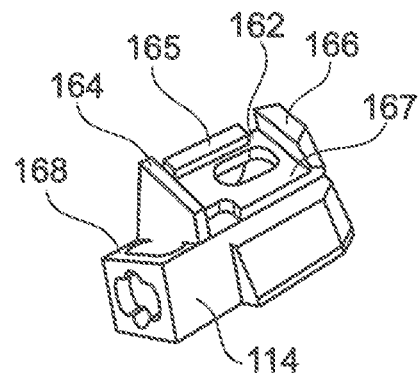
FIG. 19 shows a schematic illustration of a third embodiment of a holding device for the object receiving container of the system described herein.

FIG. 19 shows an even further embodiment of the holding device 114. This embodiment of the holding device 114 may have an oblique surface 167 in respect of a main body 168. The oblique surface 167 may be delimited by a first strip 164, a second strip 165 and a third strip 166 in such a way that the first strip 164, the second strip 165 and the third strip 166 engage around the receptacle 162 of the holding device 114. The object receiving container 125 may be arranged in the receptacle 162. On account of the oblique surface 167, it may be no longer mandatory to rotate the holding device 114, and hence also the object receiving container 125, about an axis of rotation, for example in the sample chamber 120 of the SEM 100, in the sample chamber 201 of the combination apparatus 200, in the sample chamber 426 of the particle beam apparatus 400 and/or in the light microscope 800.

Embodiments of methods according to the system described herein are described in more detail below. Explicit reference is made to the fact that these embodiments should only be understood as illustrative and that the system described herein is not restricted to these embodiments.

Figure 20:
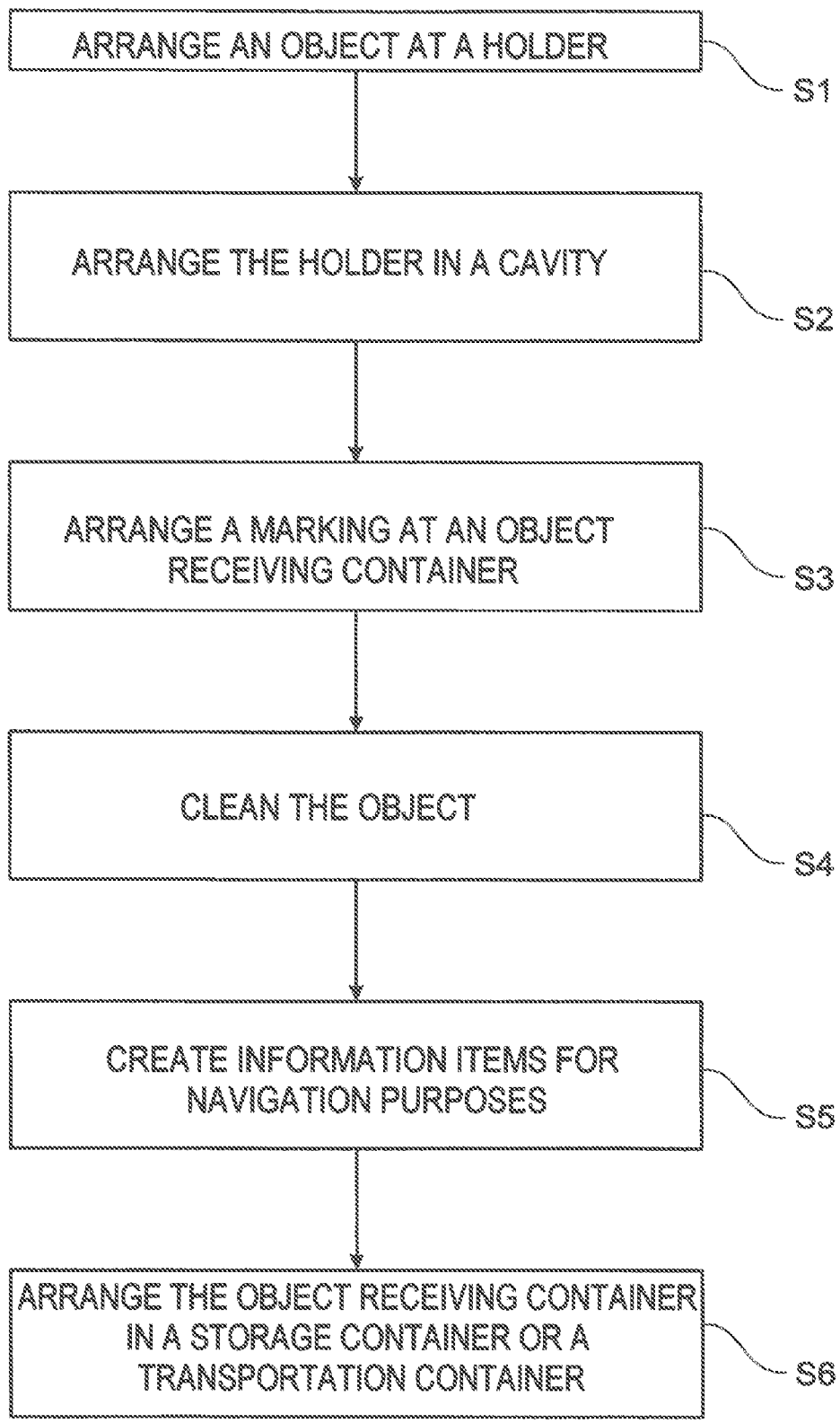
FIG. 20 shows a schematic illustration of a flowchart of a first embodiment of the method according to the system described herein.

FIG. 20 initially shows preparatory method steps of a method for examining, analyzing and/or processing an object. Initially, an object, for example the first object 158 or the second object 159, may be arranged at a holder in a method step S1. By way of example, the holder may be a commercially available TEM object holder. Subsequently, in method step S2, the holder may be arranged together with the object 158, 159, for example in the first cavity 131 or in the second cavity 132 of the object receiving container 125. This may be implemented with the mounting device 147, in which the object receiving container 125 may be arranged. The arrangement of the holder together with the object 158, 159, for example in the first cavity 131 or in the second cavity 132 of the object receiving container 125, was already described above. Therefore, reference is made to all the explanations provided above in respect of the arrangement of the holder together with the object 158, 159 in the object receiving container 125. In method step S3, at least one marking may be applied to the object receiving container 125, said marking being used as a reference marking for orientation and navigation purposes during the subsequent examination, analysis and/or processing in an apparatus, for example in one of the apparatuses already mentioned above. The object 158, 159 may be cleaned in method step S4, for example from contaminations consisting of ice. Further, information items may be created in method step S5, said information items being obtained, for example, by means of a light-microscopic examination of the object 158, 159 by using the light microscope 800. By way of example, these information items comprise the orientation of the object 158, 159, the location of contaminants present on the object 158, 159 and/or the thickness of a layer of ice on the object 158, 159. Moreover, the object receiving container 125 may be arranged in a storage container or a transportation container in method step S6. Both the storage container and the transportation container may be cooled, for example with liquid nitrogen or liquid helium. In the transportation container, the object receiving container 125 may be transported from a first examination, analysis and/or processing apparatus to a second examination, analysis and/or processing apparatus.

Figure 21:
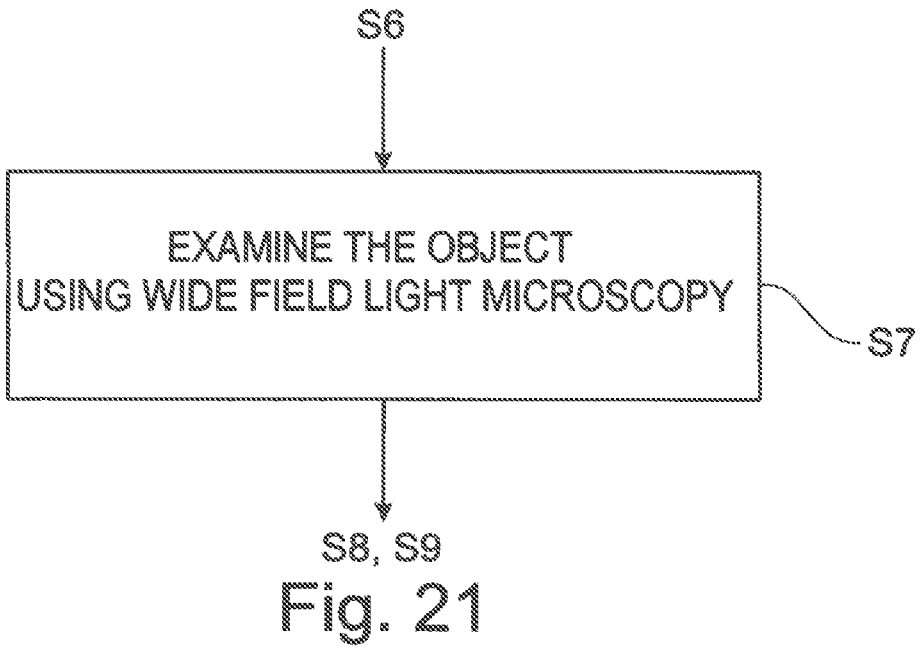
FIG. 21 shows a schematic illustration of a flowchart of a second embodiment of the method according to the system described herein.

FIG. 21 shows an optional method step S7 for a method for examining, analyzing and/or processing the object 158, 159. Here, following method step S6, the object 158, 159 may be transported in the transportation container to the light microscope 800 in method step S7. The object receiving container 125 may be taken from the transportation container and arranged at the holding device 114. The holding device 114 may be suitable for introduction into the light microscope 800. The holding device 114 may be introduced together with the object receiving container 125 into the light microscope 800. Subsequently, the second container unit 130 may be moved relative to the first container unit 129 in such a way that the second container unit 130 may be arranged in the first position relative to the first container unit 129. In the first position of the second container unit 130, the object 158, 159 arranged, for example, in the first cavity 131 or in the second cavity 132 may be accessible and may be examined using the light microscope 800 by way of wide field light microscopy. The examination results and analysis results in respect of the object 158, 159 obtained in this way, in particular the images of the object 158, 159 recorded using the light microscope 800, may be used, for example, for a correlation with examination results and analysis results in respect of the object 158, 159 which may be obtained with the SEM 100, for example. This correlation of examination results and analysis results, which were obtained using different apparatuses, also may be referred to as correlative microscopy. After completing the examination with the light microscope 800, the second container unit 130 may be brought into the second position relative to the first container unit 129 such that the first cavity 131 and/or the second cavity 132, in which the object 158, 159 may be arranged, may be sealed and the object 158, 159 may be no longer accessible. The object receiving container 125 then may be removed from the holding device 114 again and introduced into the transportation container.

Subsequently, further method steps of the method for examining, analyzing and/or processing the object 158, 159 may be carried out.

Figure 22:
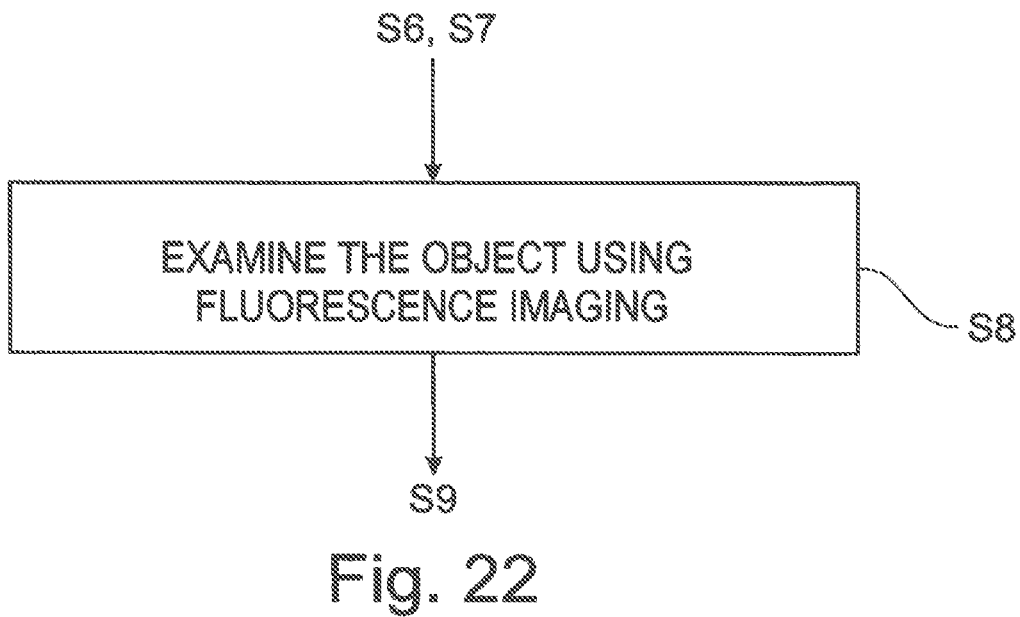
FIG. 22 shows a schematic illustration of a flowchart of a third embodiment of the method according to the system described herein.

FIG. 22 shows a further optional method step S8 for a method for examining, analyzing and/or processing the object 158, 159. Following method step S6 or S7, the object receiving container 125 having the object 158, 159 may be transported in the transportation container to a confocal laser microscope in method step S8. The object receiving container 125 may be taken from the transportation container and arranged at the holding device 114. The holding device 114 may be suitable for introduction into the confocal laser microscope. The holding device 114 may be introduced together with the object receiving container 125 into the confocal laser microscope. Subsequently, the second container unit 130 may be moved relative to the first container unit 129 in such a way that the second container unit 130 may be arranged in the first position relative to the first container unit 129. In the first position of the second container unit 130, the object 158, 159 arranged, for example, in the first cavity 131 or in the second cavity 132 may be accessible and may be examined using the confocal laser microscope by way of fluorescence imaging. The examination results and analysis results in respect of the object 158, 159 obtained in this way may be used, for example, for a correlation with examination results and analysis results in respect of the object 158, 159 which may be obtained with the SEM 100, for example. After completing the examination with the confocal laser microscope, the second container unit 130 may be brought into the second position relative to the first container unit 129 such that, in particular, the first cavity 131 and the second cavity 132, in which the object 158, 159 may be arranged, may be sealed and the object 158, 159 may be no longer accessible. The object receiving container 125 then may be removed from the holding device 114 again and introduced into the transportation container.

Figure 23:
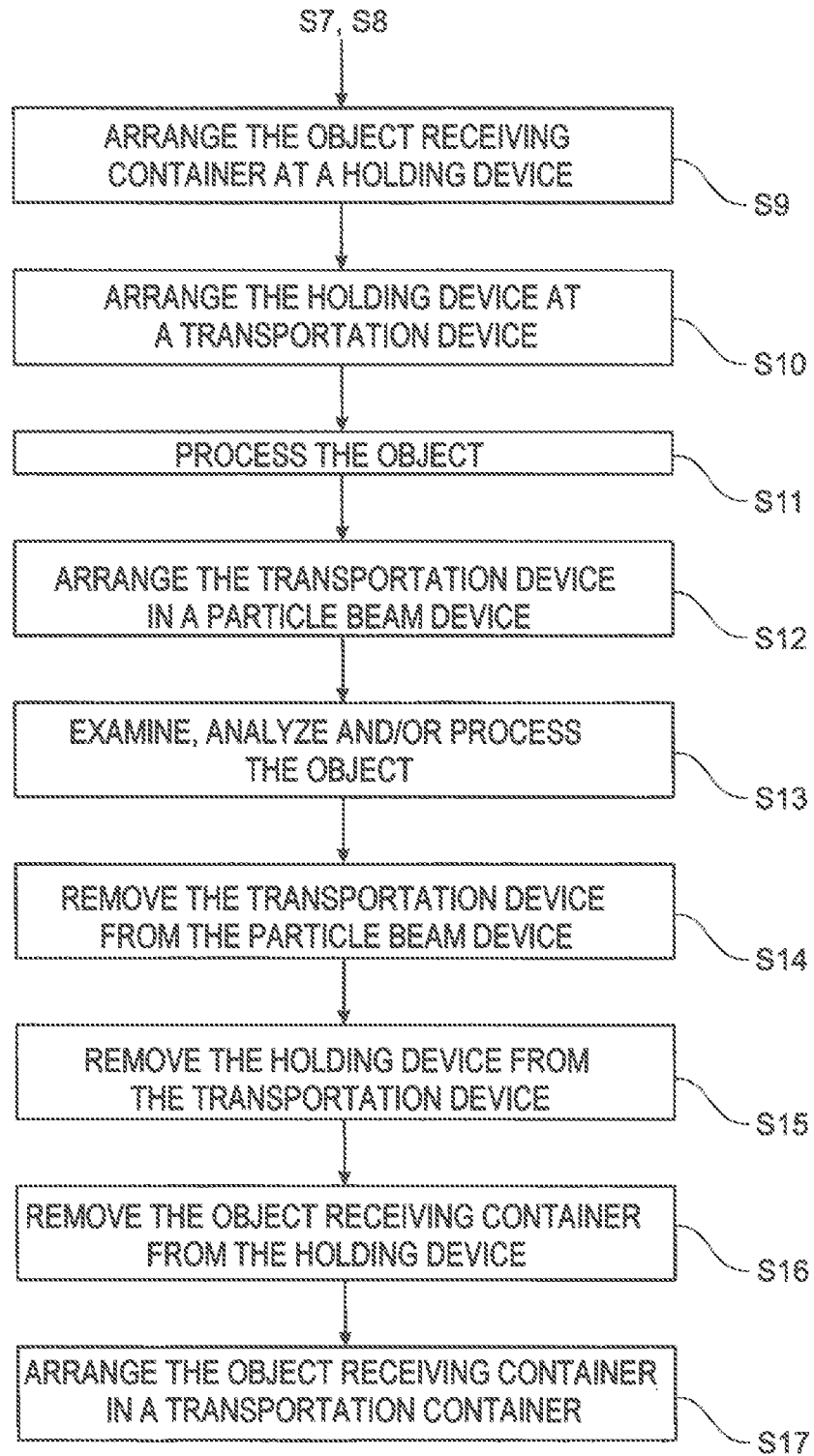
FIG. 23 shows a schematic illustration of a flowchart of a fourth embodiment of the method according to the system described herein.

Subsequently, further method steps of the method for examining, analyzing and/or processing the object may be carried out. FIG. 23 shows method steps of an embodiment of the method for examining, analyzing and/or processing the object 158, 159.

In method step S9, the object receiving container 125 having the object 158, 159 may be transported in the transportation container to a beam apparatus, for example the SEM 100, the combination apparatus 200 and/or the particle beam apparatus 400, or to the apparatus 800A for processing an object. The object receiving container 125 may be taken from the transportation container and arranged at the holding device 114. The holding device 114 may be suitable for introduction into the SEM 100, the combination apparatus 200, the particle beam apparatus 400 and/or the apparatus 800A for processing an object. In method step S10, the holding device 114 may be arranged at a transportation device. By way of example, the transportation device may be a device that is movable by means of a manipulator, which device may be movable, in particular, from a workstation arranged at the SEM 100, at the combination apparatus 200 and/or at the particle beam apparatus 400 into the sample chamber 120 of the SEM 100, into the sample chamber 201 of the combination apparatus 200 and/or into the sample chamber 426 of the particle beam apparatus 400. By way of example, such a transportation device may be referred to as a "shuttle". In method step S11, the transportation device may be transported to the workstation and introduced therein. In the workstation, the second container unit 130 may be moved relative to the first container unit 129 in such a way that the second container unit 130 may be arranged in the first position relative to the first container unit 129. In the first position of the second container unit 130, the object 158, 159 arranged, for example, in the first cavity 131 or in the second cavity 132 may be accessible and may be processed. By way of example, layers may be removed from the object 158, 159 by means of a microtome or layers may be applied to the object 158, 159 by means of a sputtering device. The workstation may be arranged at the SEM 100, at the combination apparatus 200 and/or at the particle beam apparatus 400. As an alternative thereto, the workstation, for example the apparatus 800A for processing an object, may not be coupled to the SEM 100, the combination apparatus 200 and/or the particle beam apparatus 400 but rather may be spatially separated from the SEM 100, the combination apparatus 200 and/or the particle beam apparatus 400. Once the processing of the object 158, 159 has been completed, the second container unit 130 optionally may be moved into the second position relative to the first container unit 129 such that, in particular, the first cavity 131 and/or the second cavity 132, in which the object 158, 159 is arranged, are/is sealed and the object 158, 159 is no longer accessible.

In method step S12, the transportation device and hence the object receiving container 125 arranged at the holding device 114 may be arranged in the SEM 100, the combination apparatus 200 and/or the particle beam apparatus 400. Subsequently, the object 158, 159 may be examined, analyzed and/or processed in method step S13. To this end, should the second container unit 130 be situated in the second position relative to the first container unit 129, the second container unit 130 may be moved relative to the first container unit 129 in such a way that the second container unit 130 may be arranged in the first position relative to the first container unit 129. In the first position of the second container unit 130, the object 158, 159 arranged, for example, in the first cavity 131 or in the second cavity 132 may be accessible and may be examined, analyzed and/or processed. By way of example, layers might be applied to the object 158, 159 by electron beam-induced deposition or ion beam-induced deposition, for example using a gas. In addition or as an alternative thereto, layers of the object 158, 159 may be ablated by means of the ion beam. In addition or as an alternative thereto, the object 158, 159 may be imaged by means of the electron beam and/or the ion beam. Yet again in addition or as an alternative thereto, interaction radiation, in particular x-rays, may be detected and used for analyzing the object 158, 159.

After completing the examination, the analysis and/or the processing of the object 158, 159, the second container unit 130 may be brought into the second position relative to the first container unit 129 in method step S14 such that, in particular, the first cavity 131 and the second cavity 132, in which the object 158, 159 may be arranged, are/is sealed and the object 158, 159 is no longer accessible. The transportation device may be removed from the SEM 100, the combination apparatus 200 and/or the particle beam apparatus 400 again. In method step S15, the holding device 114 may be removed from the transportation device. Moreover, the object receiving container 125 may be removed from the holding device 114 again in method step S16. In method step S17, the object receiving container 125 may be introduced into the transportation container. As an alternative thereto, the object 158, 159 may be removed from the object receiving container 125 together with its holder and may be arranged in a sample container. The sample container in turn may be arranged in a Dewar filled with nitrogen. The sample container may be stored therein until the object is examined, analyzed and/or processed further.

In one embodiment of the method according to the system described herein, the object receiving container 125 may be introduced into the combination apparatus 200. In this embodiment, regions on the object may be identified in method step S13 by a superposition of image representations, which were created, firstly, with the light microscope 800 and, secondly, with the SEM 100. In addition or as an alternative thereto, these regions may be identified by imaging with the SEM 100 or the ion beam apparatus 300. Further, provision may be made, for example, for a precursor material to be arranged at these regions, in particular by ion beam-induced deposition, for example using a gas. The precursor material may serve the protection of the identified regions in particular. Subsequently, material of the object 158, 159 may be ablated in the identified regions using the ion beam apparatus 300 until the object 158, 159 may have a thickness of approximately 300 nm to 500 nm. Subsequently, material of the object 158, 159 may be ablated in the identified regions using the ion beam apparatus 300 until the object 158, 159 may have a thickness of 200 nm or less. If the transportation device, and hence also the object receiving container 125, may be removed from the sample chamber 201 of the combination apparatus 200, the transportation device may be introduced into the aforementioned workstation together with the holding device 114 in order to apply a material layer to the object 158, 159 by means of a sputtering device so as to reduce the charging of the object 158, 159 during a subsequent examination by means of a TEM.

In a further embodiment of the method according to the system described herein, in which the object receiving container 125 is introduced in the combination apparatus 200, a portion of the object 158, 159 of interest may be cut out of the object 158, 159 by means of the ion beam apparatus 300 and fastened to a manipulator. By means of the manipulator, the portion of interest may be lifted out of the object 158, 159 and fastened to a TEM object holder, which may be arranged at the object receiving container 125. At least one of the method steps already described further above may be carried out in this embodiment. The portion of interest may be examined in a TEM.

Explicit reference is made to the fact that before each method step during which the object 158, 159 arranged at the object receiving container 125 must be accessible, the second container unit 130 may be brought into the first position relative to the first container unit 129 such that, in particular, the first cavity 131 and/or the second cavity 132, in which the object 158, 159 may be arranged, may be opened and the object 158, 159 may be accessible. If the object receiving container 125 is transported, then the second container unit 130 may be brought into the second position relative to the first container unit 129 such that, in particular, the first cavity 131 and/or the second cavity 132, in which the object 158, 159 may be arranged, may be sealed and the object 158, 159 may not be accessible.

The object receiving container 125 allows safe and simple transportation between two examination apparatuses. In particular, the object receiving container 125 may ensure protection against contamination of the object 158, 159 arranged in, for example, the first cavity 131 and/or the second cavity 132 on account of the relative movement of the second container unit 130 with respect to the first container unit 129 into the second position and on account of the cover obtained therewith. Moreover, the object receiving container 125 may ensure that the object 158, 159 may be stored safely over a relatively long period of time, for example multiple days or months. Since the object 158, 159 need not be removed from the object receiving container 125 during storage, for example in a nitrogen-cooled storage container, the orientation of the object 158, 159 in the object receiving container 125 does not change. This simplifies a subsequent examination of the object 158, 159 by means of an examination apparatus since the object receiving container 125 may be insertable into the examination apparatus after removing the object receiving container 125 from the storage container, with the orientation of the object 158, 159 already known. In particular, information about the alignment and orientation of the object 158, 159 may be arranged at the object receiving container 125 by means of a marking. Further, the object receiving container 125 may ensure that the latter may be arranged in as many different examination apparatuses as possible. The object receiving container 125 may be arranged at the holding device 114. The holding device 114 may be configured in such a way that, by means of the holding device 114, the object receiving container 125 may be arranged at a receiving device, for example the object stage 122, 424 of the SEM 100, of the combination apparatus 200, of the particle beam apparatus 400, of the light microscope 800, of the mounting device 147, and/or at the aforementioned workstation. In contrast to the prior art, the system described herein consequently makes it possible for the object 158, 159 to not have to be arranged at respective different object holders, which have a physical configuration specified for a respective apparatus, for the purposes of examining and/or processing the object 158, 159 in different apparatuses. Rather, the system described herein may provide for the object 158, 159 to be arranged only once at the object receiving container 125 according to the system described herein, which then may be receivable in the various examination apparatuses.

The system described herein may ensure that an object 158, 159 arranged in the object receiving container 125 is easily examinable, analyzable and/or processable with different work procedures under cryo-temperatures. By way of example, the object receiving container 125 may be used to examine and/or analyze the object 158, 159 by means of x-ray spectroscopy, by means of near field scanning microscopy, by means of atomic force microscopy, by means of the combination apparatus 200, by means of transmission electron microscopy, by means of Raman spectroscopy and/or by means of secondary ion mass spectrometry. In addition or as an alternative thereto, the object receiving container 125 may be used when polishing the object 158, 159, when cutting the object 158, 159 by means of a blade or a laser and/or when applying materials to the object 158, 159. The aforementioned lists should be understood to be illustrative. The object receiving container 125 may be used for any desired and suitable method.

Figure 24:
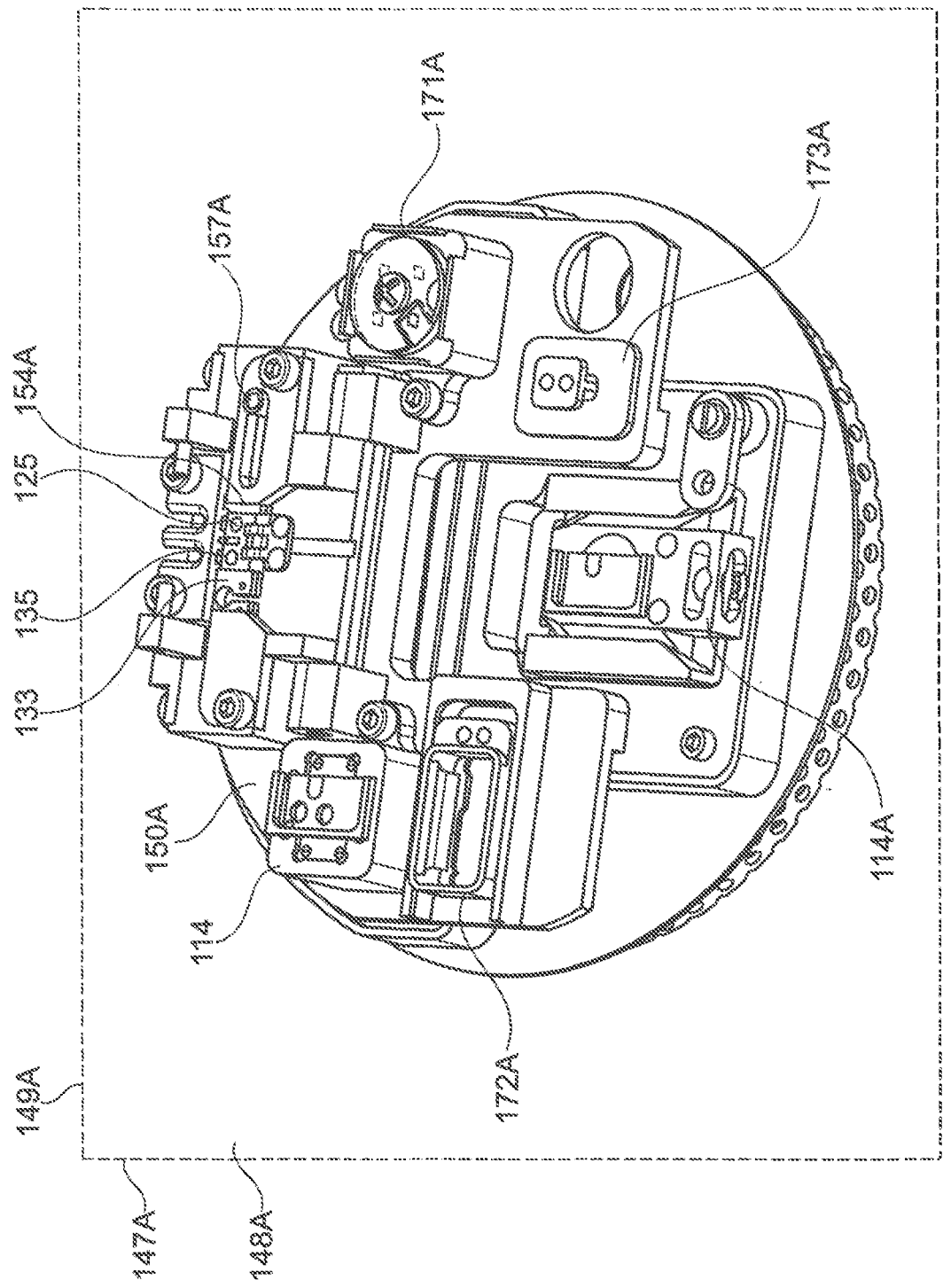
FIG. 24 shows a schematic illustration of a further mounting device for an object receiving container, according to an embodiment of the system described herein.

FIG. 24 shows an embodiment of a further mounting device 147A, by means of which, for example, the first object may be arranged in the first cavity 131 and the second object may be arranged in the second cavity 132 of the object receiving container 125 as per FIGS. 7 to 10. The mounting device 147A may have an interior 148A, which may be surrounded by an insulated wall 149A. A holder 150A for the object receiving container 125 may be arranged in the interior 148A. The object receiving container 125 may be arranged in a receptacle 154A of the holder 150A in order to mount the first object in the first cavity 131 and the second object in the second cavity 132 of the object receiving container 125. The object receiving container 125 may be fastened in the receptacle 154A by means of the fastening device 133. To this end, an actuation tool engages in the first engagement opening 143 of the first spring end 141 and in the second engagement opening 144 of the second spring end 142 (cf. FIGS. 7 to 9). Thereupon, the first spring end 141 and the second spring end 142 may be moved toward one another. Subsequently, the object receiving container 125 may be inserted into the receptacle 154A. By removing the actuation tool from the first engagement opening 143 of the first spring end 141 and from the second engagement opening 144 of the second spring end 142, the first spring end 141 and the second spring end 142 move apart, and so an outer surface of the fastening device 133 rests against an inner surface of the receptacle 154A. In this way, the object receiving container 125 may be held in clamping fashion in the receptacle 154A.

Figure 25:
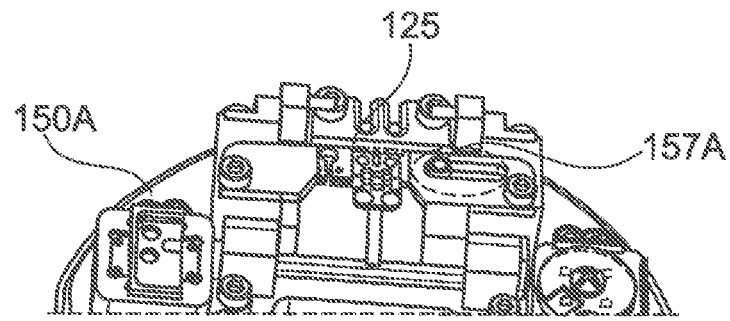
FIG. 25 shows a schematic illustration of a first partial view of the further mounting device according to FIG. 24, according to an embodiment of the system described herein.
Figure 26:
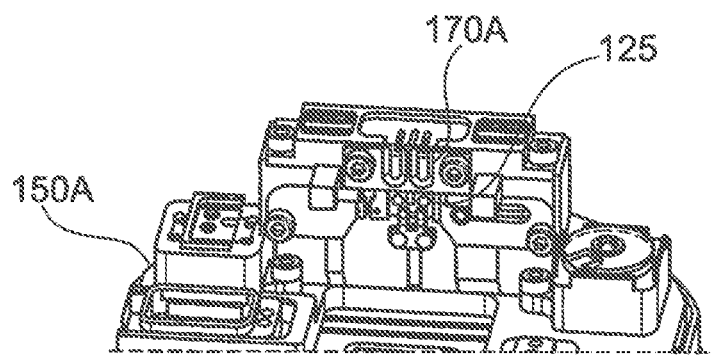
FIG. 26 shows a schematic illustration of a second partial view of the further mounting device according to FIG. 24, according to an embodiment of the system described herein.
Figure 27:
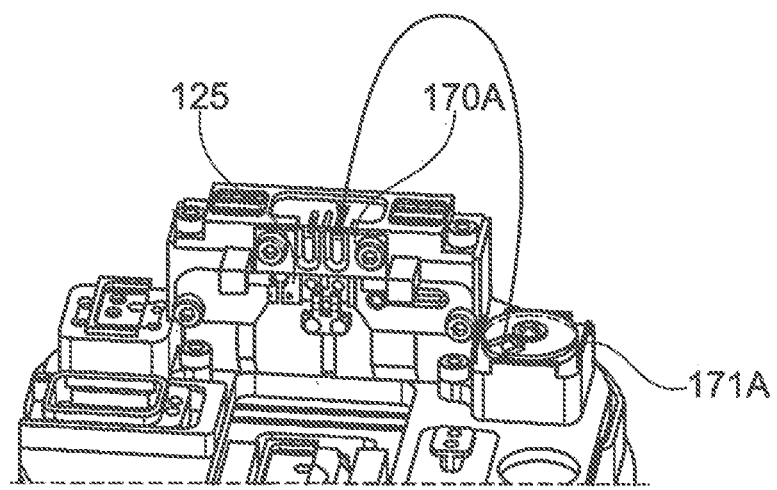
FIG. 27 shows a schematic illustration of a third partial view of the further mounting device according to FIG. 24, according to an embodiment of the system described herein.

By filling the interior 148A of the mounting device 147A, for example with liquid nitrogen or liquid helium, the object receiving container 125 may be cooled to cryo-temperatures, and so the first object may be mounted in the first cavity 131 and the second object may be mounted in the second cavity 132 of the object receiving container 125 under cryo-temperatures. To this end, the clamping unit 135 embodied as a spring may be raised by a rod-shaped unit (not illustrated in FIG. 24). By way of example, the rod-shaped unit may be raised and lowered by means of a sliding-block guide by moving an actuation unit 157A (cf. FIG. 25). Subsequently, the holder 150A may be rotated through a predefinable angle. By way of example, the holder 150A may be rotated in such a way (cf. FIG. 26) that the object receiving container 125 may be oriented in such a way that the first object is insertable into a sliding device 170A and slides into the first cavity 131 under the action of gravity. To this end, the first object may be taken from a storage container 171A and placed against and inserted into the sliding device 170A. Further, the second object is taken from the storage container 171A and inserted into the sliding device 170A. The second object slides into the second cavity 132 under the action of gravity. In particular, the object receiving container 125 may be oriented in such a way that the first object slides into the first cavity 131 in substantially vertical fashion or in vertical fashion from the sliding device 170A. In particular, the object receiving container 125 may be oriented in such a way that the second object slides into the second cavity 132 in substantially vertical fashion or in vertical fashion from the sliding device 170A. Subsequently, the clamping unit 135 may be lowered by the rod-shaped unit 155, and so the first object is held in securely clamping fashion in the first cavity 131 and the second object is held in securely clamping fashion in the second cavity 132 of the object receiving container 125.

In one embodiment, the holder 150A may subsequently be rotated into the original position through the predefinable angle again. By way of example, the object receiving container 125 then may be arranged at the holding device 114 or at a further holding device 114A (cf. FIG. 24). The holding device 114 and the further holding device 114A differ from one another in terms of the physical configuration. By way of example, the holding device 114 may only be used in a first examination, analysis and/or processing apparatus. By contrast, the further holding device 114A may only be used in a second examination, analysis and/or processing apparatus. As an alternative thereto, the object receiving container 125 may be inserted in a transportation box 172A. The transportation box 172A then may be sealed with a lid 173A, which may be arranged at the holding device 150A.

The features of the system described herein, in the written description of the specification, drawings and the claims, may be essential for the realization of the invention in the various embodiments thereof, both individually and in arbitrary combinations. The invention is not restricted to the described embodiments. It may be varied within the scope of the claims and taking into account the knowledge of the relevant person skilled in the art. Other embodiments of the invention will be apparent to those skilled in the art from a consideration of the specification and/or an attempt to put into practice the system described herein. It is intended that the specification and examples be considered as illustrative only, with the true scope and spirit of the invention being indicated by the following claims.

The invention claimed is:

1. An object receiving container for receiving at least one object which is examinable, analyzable and/or processable at cryo-temperatures, comprising:
   at least one first container unit;
   at least one cavity for receiving the object, wherein the cavity is arranged at the first container unit;
   at least one second container unit, which is embodied to be movable relative to the first container unit, wherein the second container unit is able to be brought into a first position relative to the first container unit to make the object accessible and into a second position relative to the first container unit, wherein the second container unit in the second position covers the cavity arranged at the first container unit to make the object inaccessible; and
   at least one fastening device which is arranged at the first container unit or at the second container unit for arranging the object receiving container at a holding device.

2. The object receiving container as claimed in claim 1, wherein the second container unit is arranged at a displacing device in such a way that the second container unit is able to be displaced into the first position and/or into the second position relative to the first container unit.

3. The object receiving container as claimed in claim 1, wherein the object receiving container comprises at least one hinge device which is arranged both at the first container unit and at the second container unit in such a way that the second container unit is able to be brought into the first position and/or into the second position relative to the first container unit.

4. The object receiving container as claimed in claim 1, wherein the object receiving container comprises one of the following features:
   (i) the fastening device includes a spring device;
   (ii) the fastening device includes a clamping device;
   (iii) the fastening device includes a first clamping part and a second clamping part;
   (iv) the fastening device includes a snap ring;
   (v) the fastening device includes a screw; and
   (vi) the fastening device includes an eccentric disk.

5. The object receiving container as claimed in claim 1, wherein:
   the fastening device has at least one first spring end and at least one second spring end,
   the first spring end and the second spring end are arranged at a distance from one another, and
   the first spring end is embodied so as to be movable relative to the second spring end.

6. The object receiving container as claimed in claim 5, wherein:
   the first spring end has a first engagement opening for the engagement of an actuation tool, and
   the second spring end has a second engagement opening for the engagement of the actuation tool.

7. The object receiving container as claimed in claim 1, wherein:
   the first container unit has a first surface, wherein the first surface is arranged in a first plane,
   the second container unit has a second surface, wherein the second surface is arranged in a second plane,
   in the second position of the second container unit relative to the first container unit, the first surface of the first container unit rests against the second surface of the second container unit in such a way that the cavity is covered by the second surface of the second container unit, and
   in the first position of the second container unit relative to the first container unit, the first surface of the first container unit is arranged with respect to the second surface of the second container unit in such a way that the first plane is aligned with respect to the second plane as follows:
   (i) the first plane is aligned parallel to the second plane; or
   (ii) the first plane is identical to the second plane; or
   (iii) the first plane is aligned at an angle of more than 5° with respect to the second plane.

8. The object receiving container as claimed in claim 1, wherein:
   the cavity has at least one first cavity opening and at least one second cavity opening,
   the second container unit covers the first cavity opening in the second position of the second container unit relative to the first container unit, and
   a covering device for covering the second cavity opening is arranged at the second cavity opening.

9. The object receiving container as claimed in claim 8, wherein the first cavity opening and the second cavity opening are arranged opposite one another.

10. The object receiving container as claimed in claim 8, wherein the covering device is embodied as a sliding device.

11. An object holding system comprising:
   at least one object receiving container for receiving at least one object which is examinable, analyzable and/or processable at cryo-temperatures, including:
      at least one first container unit,
      at least one cavity for receiving the object, wherein the cavity is arranged at the first container unit,
      at least one second container unit, which is embodied to be movable relative to the first container unit, wherein the second container unit is able to be brought into a first position relative to the first container unit to make the object accessible and into a second position relative to the first container unit, wherein the second container unit in the second position covers the cavity arranged at the first container unit to make the object inaccessible, and
      at least one fastening device which is arranged at the first container unit or at the second container unit for arranging the object receiving container at a holding device; and
   at least one holding device, which comprises a receptacle, wherein the fastening device of the object receiving container is arranged at the receptacle.

12. A beam apparatus for imaging, analyzing and/or processing an object, comprising:
   at least one beam generator for generating a beam;
   at least one objective lens for focusing the beam onto the object;
   at least one display device for displaying an image and/or an analysis of the object;
   at least one cooling device for cooling the object to cryo-temperatures; and
   at least one object receiving container for receiving at least one object, wherein the at least one object is examinable, analyzable and/or processable at cryo-temperatures, wherein the at least one object receiving container is arranged at the cooling device and includes:
      at least one first container unit,
      at least one cavity for receiving the object, wherein the cavity is arranged at the first container unit,
      at least one second container unit, which is embodied to be movable relative to the first container unit, wherein the second container unit is able to be brought into a first position relative to the first container unit to make the object accessible and into a second position relative to the first container unit, wherein the second container unit in the second position covers the cavity arranged at the first container unit to make the object inaccessible, and
      at least one fastening device which is arranged at the first container unit or at the second container unit for arranging the object receiving container at a holding device.

13. A beam apparatus for imaging, analyzing and/or processing an object, comprising:
   at least one beam generator for generating a beam,
   at least one objective lens for focusing the beam onto the object,
   at least one display device for displaying an image and/or an analysis of the object,
   at least one cooling device for cooling the object to cryo-temperatures, and comprising
   at least one object holding system, which is arranged at the cooling device, the at least one object holding system including:

at least one object receiving container for receiving at least one object which is examinable, analyzable and/or processable at cryo-temperatures, including:
at least one first container unit,
at least one cavity for receiving the object, wherein the cavity is arranged at the first container unit,
at least one second container unit, which is embodied to be movable relative to the first container unit, wherein the second container unit is able to be brought into a first position relative to the first container unit to make the object accessible and into a second position relative to the first container unit, wherein the second container unit in the second position covers the cavity arranged at the first container unit to make the object inaccessible, and
at least one fastening device which is arranged at the first container unit or at the second container unit for arranging the object receiving container at a holding device; and
   at least one holding device, which comprises a receptacle, wherein the fastening device of the object receiving container is arranged at the receptacle.

14. The beam apparatus as claimed in claim 12, wherein:
the beam apparatus is embodied as a particle beam apparatus,
the beam generator is embodied to generate a particle beam with charged particles,
the beam apparatus comprises at least one scanning device for scanning the particle beam over the object, and
the beam apparatus comprises at least one detector for detecting interaction particles and/or interaction radiation, which result/results from an interaction of the particle beam with the object.

15. The beam apparatus as claimed in claim 14, wherein the beam generator is embodied as a first beam generator and the particle beam is embodied as a first particle beam with first charged particles, wherein the objective lens is embodied as a first objective lens for focusing the first particle beam onto the object, and wherein the particle beam apparatus further comprises:
at least one second beam generator for generating a second particle beam with second charged particles; and
at least one second objective lens for focusing the second particle beam onto the object.

16. The beam apparatus as claimed in claim 14, wherein the beam apparatus is an electron beam apparatus and/or an ion beam apparatus.

17. The beam apparatus as claimed in claim 12 wherein:
the beam apparatus is a light beam apparatus, and
the beam generator is embodied to generate light beams.

* * * * *